(12) United States Patent
Narushima

(10) Patent No.: US 8,334,208 B2
(45) Date of Patent: Dec. 18, 2012

(54) FILM-FORMING METHOD AND FILM-FORMING APPARATUS

(75) Inventor: Kensaku Narushima, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 13/158,120

(22) Filed: Jun. 10, 2011

(65) Prior Publication Data

US 2011/0237076 A1 Sep. 29, 2011

Related U.S. Application Data

(63) Continuation of application No. PCT/JP2009/070724, filed on Dec. 11, 2009.

(30) Foreign Application Priority Data

Dec. 12, 2008 (JP) ................................ 2008-317035

(51) Int. Cl.
*H01L 21/3205* (2006.01)

(52) U.S. Cl. ................. 438/685; 257/E21.295

(58) Field of Classification Search .............. 118/723 R, 118/725; 257/E21.295, E21.296; 427/229, 427/253, 585–587; 438/655, 656, 680, 683, 438/685, 763, 769

See application file for complete search history.

(56) References Cited

U.S. PATENT DOCUMENTS 5,149,514 A * 9/1992 Sanjurjo ....................... 423/344
6,626,186 B1 9/2003 Hillman et al.
2005/0233093 A1 10/2005 Tada et al.
2005/0257747 A1 11/2005 Wakabayashi et al.
2007/0227668 A1 10/2007 Iizuka
2008/0199613 A1 * 8/2008 Bhat et al. ................ 427/255.28

FOREIGN PATENT DOCUMENTS

| JP | 60-116776 | 6/1985 |
|---|---|---|
| JP | 04-501886 | 4/1992 |
| JP | 2002-512307 | 4/2002 |
| JP | 2004-197219 | 7/2004 |

(Continued)

OTHER PUBLICATIONS

Lee, Chi-Young. The Preperation of Titanium-Based Thin Film by CVD Using Titanium Chlorides as Precursors. Chemical Vapor Deposition, 1999, vol. 5 No. 2, pp. 69-73.*

(Continued)

*Primary Examiner* — Julio J. Maldonado
*Assistant Examiner* — Daniel Shook
(74) *Attorney, Agent, or Firm* — Oblon, Spivak, McClelland, Maier & Neustadt, L.L.P.

(57) ABSTRACT

A film forming method includes arranging a target substrate to be processed in a chamber; supplying a processing gas including a chlorine containing gas through a supply path to the chamber in which the target substrate is arranged; and arranging a Ti containing unit in the supply path of the processing gas and making a reaction between the chlorine containing gas of the processing gas and Ti of the Ti containing unit by bringing the chlorine containing gas into contact with the Ti containing unit, when the processing gas is supplied to the chamber. The method further includes depositing Ti on a surface of the target substrate by a thermal reaction by supplying to the target substrate a Ti precursor gas produced by the reaction between the chlorine containing gas and Ti of the Ti containing unit while heating the target substrate provided in the chamber.

33 Claims, 21 Drawing Sheets

FOREIGN PATENT DOCUMENTS

| | | |
|---|---|---|
| JP | 2004-285469 | 10/2004 |
| JP | 2007-254868 | 10/2007 |
| JP | 2007-270309 | 10/2007 |
| JP | 2008-274343 | 11/2008 |
| KR | 10-2006-0041306 | 5/2006 |
| KR | 10-2007-0065356 | 6/2007 |
| WO | WO00/63959 A1 * | 10/2000 |
| WO | WO 2008/007675 | 1/2008 |

OTHER PUBLICATIONS

International Search Report issued Mar. 9, 2010 in International Application No. PCT/JP2009/070724 filed Dec. 11, 2009.

C. Y. Lee, The Preparation of Titanium-Based Thin Film by CVD Using Titanium Chlorides as Precursors, Chemical Vapor Deposition, 1999, vol. 5 No. 2, pp. 69-73.

* cited by examiner

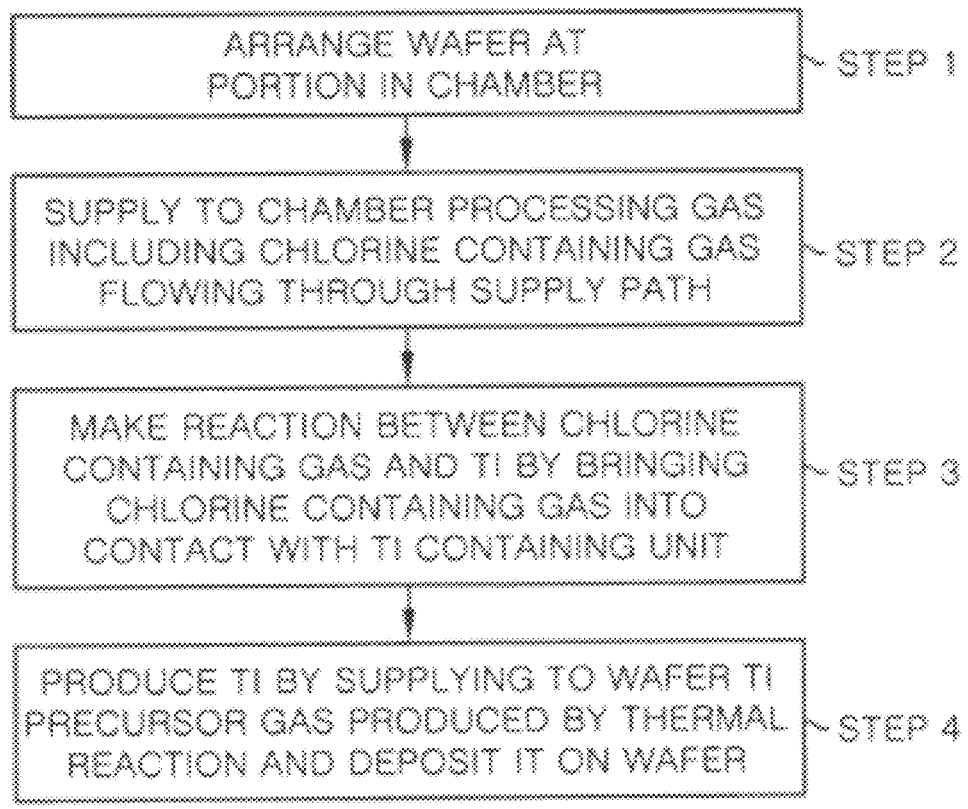

US 8,334,208 B2

FILM-FORMING METHOD AND FILM-FORMING APPARATUS

This application is a Continuation Application of PCT International Application No. PCT/JP2009-070724 filed on Dec. 11, 2009, which designated the United States.

FIELD OF THE INVENTION

The present invention relates to a film forming method and apparatus, for forming a Ti film or $TiSi_x$ film on the surface of a target substrate to be processed arranged in a chamber by CVD.

BACKGROUND OF THE INVENTION

In recent years, as an increased density and an increased integration degree are required in manufacturing semiconductor devices, multi-layered wiring structures have been increasingly used for circuitry. Under the circumstances, embedding techniques for electrical connection between layers have become important at contact holes or trenches used as connection portions between a Si substrate serving as a lower layer and wiring layers serving as upper layers.

In order to make an ohmic connection between a Si substrate serving as a lower layer and a metal layer (plug) such as a tungsten (W) film or the like used for an embedment of contact holes, trenches or via holes, a Ti film is formed inside the contact holes or the via holes before the embedment and, if necessary, a TiSi film is formed by a reaction between Ti and underlying Si. Thereafter, a TiN film serving as a barrier film is formed.

Such Ti film has been conventionally formed by physical vapor deposition (PVD). However, chemical vapor deposition (CVD) having further increased step coverage is frequently used to satisfy recent devices having smaller sizes and higher integration degrees.

A technique for forming a Ti film by using plasma CVD has been suggested (e.g., Japanese Patent Application publication No. 2004-197219), wherein $TiCl_4$ gas, $H_2$ gas and Ar gas are used as a film forming gas used for CVD formation of the Ti film; the film forming gas is introduced into a chamber through a shower head; and, by supplying a high frequency power to a parallel plate electrode while heating a semiconductor wafer by a stage heater, the film forming gas is converted to a plasma thereby making the $TiCl_4$ gas react with the $H_2$ gas.

Although, however, recent semiconductor devices become scaled down, plasma damages such as breakdown of devices on semiconductor wafers are caused due to using the plasma in forming the Ti film by the conventional CVD. As the recent semiconductor devices become scaled down, such plasma damages cannot be ignored.

SUMMARY OF THE INVENTION

In view of the above, the present invention provides a film forming method and a film forming apparatus, capable of forming a Ti film or TiSi, film by CVD without causing a plasma damage on a target substrate to be processed.

In accordance with a first aspect of the present invention, there is provided a film forming method which includes arranging a target substrate to be processed in a chamber; supplying a processing gas including a chlorine containing gas through a supply path to the chamber in which the target substrate is arranged; arranging a Ti containing unit in the supply path of the processing gas and making a reaction between the chlorine containing gas of the processing gas and Ti of the Ti containing unit by bringing the chlorine containing gas into contact with the Ti containing unit, when the processing gas is supplied to the chamber; and depositing Ti on a surface of the target substrate by a thermal reaction by supplying to the target substrate a Ti precursor gas produced by the reaction between the chlorine containing gas and Ti of the Ti containing unit while heating the target substrate provided in the chamber.

In accordance with a second aspect of the present invention, there is provided a film forming method which includes forming a Ti film in a gas introduction mechanism for introducing a processing gas to a chamber by supplying a gas including $TiCl_4$ gas to the gas introduction mechanism under a state in which a target substrate to be processed is not arranged in the chamber; loading the target substrate into the chamber; introducing a processing gas including a chlorine containing gas to the chamber through the gas introduction mechanism; making a reaction between the chlorine containing gas of the processing gas and Ti of the Ti film by bringing the chlorine containing gas into contact with the Ti film, when the processing gas is introduced to the chamber; and depositing Ti on a surface of the target substrate by a thermal reaction by supplying to the target substrate a Ti precursor gas produced by the reaction between the chlorine containing gas and Ti of the Ti film while heating the target substrate provided in the chamber.

In accordance with a third aspect of the present invention, there is provided a film forming apparatus which includes a chamber for accommodating therein a target substrate to be processed; a mounting table for mounting the target substrate thereon in the chamber; first heater for heating the target substrate mounted on the mounting table; a gas introduction mechanism for introducing a processing gas from a gas supply source to the chamber through a gas line; a Ti containing unit provided in a supply path of the processing gas; a second heater for heating the Ti containing unit; a gas exhaust unit for exhausting the chamber; and a control unit for controlling a processing in the chamber. Under the control of the control unit, the target substrate is loaded into the chamber to be mounted onto the mounting table; a processing gas including a chlorine containing gas is introduced into the chamber through the supply line and the gas introduction mechanism; the chlorine containing gas of the processing gas is made to react with Ti of the Ti containing unit by bringing the chlorine containing gas into contact with the Ti containing unit and heating it with the second heater; and Ti is deposited on a surface of the target substrate by a thermal reaction by supplying to the target substrate a Ti precursor gas produced by the reaction between the chlorine containing gas of the processing gas and Ti of the Ti containing unit while heating the target substrate mounted on the mounting table by the first heater.

In accordance with a forth aspect of the present invention, there is provided a film forming apparatus which includes a chamber for accommodating therein a target substrate to be processed; a mounting table for mounting the target substrate thereon in the chamber; a first heater for heating the target substrate mounted on the mounting table; a gas introduction mechanism for introducing a processing gas from a gas supply source to the chamber through a gas line; a second heater for heating the gas introduction mechanism; a plasma generating unit for generating a plasma of the processing gas; a gas exhaust unit for exhausting the chamber; and a control unit for controlling a processing in the chamber. Under the control of the control unit, a Ti film is formed in the gas introduction mechanism by supplying $TiCl_4$ gas to the gas introduction mechanism under a state in which the target substrate is not arranged in the chamber; the target substrate is loaded into the chamber to be mounted onto the mounting table; a processing gas including a chlorine containing gas is introduced into the chamber through the supply line and gas introduction mechanism; the chlorine containing gas of the processing gas is made to react with Ti of the Ti film by bringing the chlorine containing gas into contact with the Ti film and heating it with the second heater; and Ti is deposited on a surface of the target substrate by a thermal reaction by supplying to the target substrate a Ti precursor gas produced by the reaction between the chlorine containing gas of the processing gas and Ti of the Ti film while heating the target substrate mounted on the mounting table by the first heater.

Through the repeated reviews for resolving the objects, the present inventors have discovered that, when a Ti containing unit is arranged in a gas supply path inside the chamber and a processing gas including a chlorine containing gas such as $TiCl_4$ gas is supplied to the gas supply path, Ti reacts with the chorine containing gas, thereby producing a Ti precursor gas such as $TiCl_3$ gas or $TiCl_2$ gas and the Ti precursor gas produces Ti by a thermal reaction regardless of the plasma. The present invention having the above structure has been completed based on their perceptions.

BRIEF DESCRIPTION OF THE DRAWINGS

FIG. 1 is a flowchart showing a Ti film forming method in accordance with the present invention;

DETAILED DESCRIPTION OF THE EMBODIMENTS

An embodiment of the present invention will now be described with reference to the accompanying drawings.

In the following description, mL/min is used as the unit of a gas flow rate. Since the volume of a gas is significantly varied depending on temperature and pressure, a standardized value is used in the present embodiment. As the standardized unit of a gas flow rate, standard cubic centimeter per minutes (sccm) is typically used. Herein, sccm is used together. In the description, a standard state indicates a temperature of 0° C. (273.15 K) and an atmospheric pressure of 1 atm (101325 Pa).

Figure 2A:
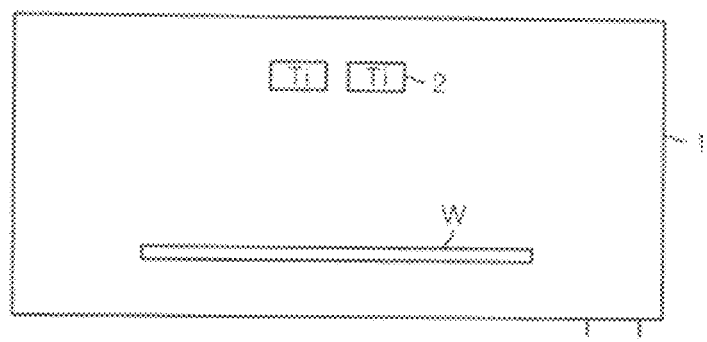
FIG. 2A is a schematic view for explaining a principle of the Ti film forming method in accordance with the present invention.
Figure 2B:
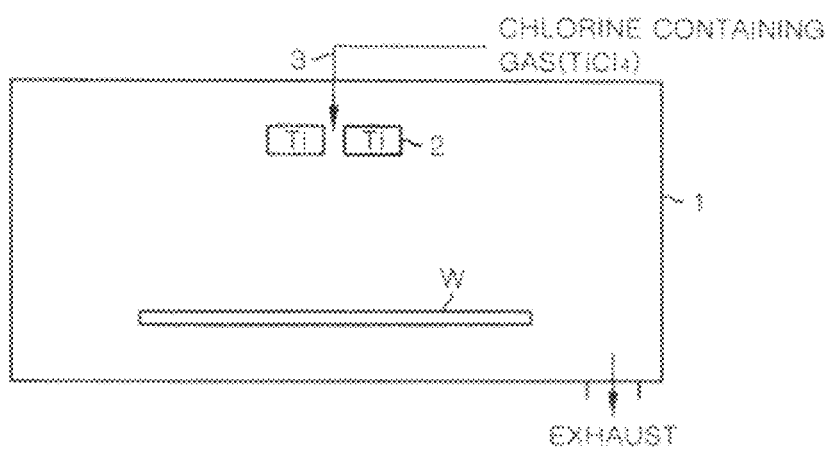
FIG. 2B is a schematic view for explaining a principle of the Ti film forming method in accordance with the present invention.
Figure 2C:
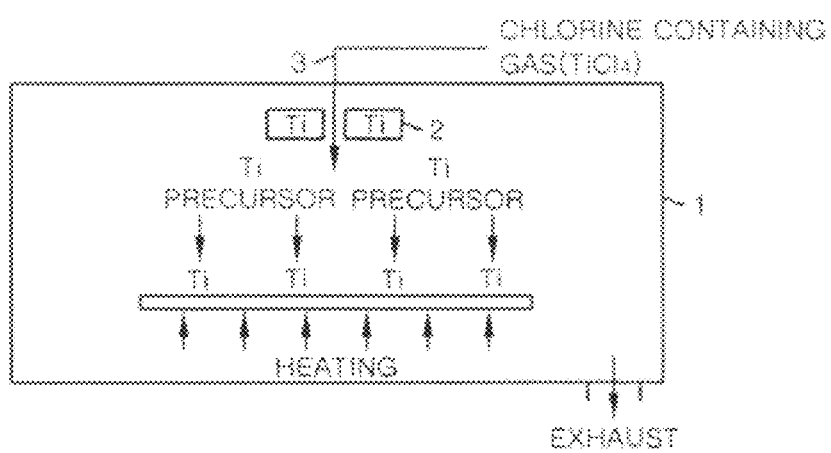
FIG. 2C is a schematic view for explaining a principle of the Ti film forming method in accordance with the present invention.

FIG. 1 is a flowchart showing a Ti film forming method in accordance with the present invention, and FIGS. 2A to 2C are schematic views for explaining a principle of the Ti film forming method in accordance with the present invention.

First, as shown in FIG. 2A, a semiconductor wafer (hereinafter, simply referred to as "wafer") serving as a target substrate is arranged at a position in a chamber 1 (step 1).

Next, as shown in FIG. 2B, a processing gas including a chlorine containing gas, e.g., $TiCl_4$ gas, is supplied to the chamber 1 through a supply path 3 while the chamber 1 is exhausted and maintained at a vacuum level (step 2).

A Ti containing unit containing Ti is provided in the supply path 3. The chlorine containing gas ($TiCl_4$ gas) flowing through the supply path 3 is allowed to react with Ti of the Ti containing unit 2 by bring it into contact with the Ti containing unit 2 (step 3). In other words, Ti of the Ti containing unit 2 is etched by using the chlorine containing gas.

As the chlorine containing gas, $Cl_2$ gas or HCl gas may be used instead of $TiCl_4$ gas. However, it is preferable to use $TiCl_4$ gas, which has been conventionally used as a Ti film forming source.

Next, as shown in FIG. 2C, a Ti precursor gas produced in the reaction between the chlorine containing gas and Ti of the Ti containing unit 2 in step 3 is supplied to the wafer W that is heated to a predetermined temperature. Thus, Ti is produced by the heat reaction, whereby the produced Ti is deposited on the wafer W (step 4).

The deposited Ti becomes a Ti film as it is or a TiSi film by the reaction with Si of an underlying Si layer (Si or polysilicon substrate) under a predetermined condition.

The reaction between the chlorine containing gas and Ti of the Ti containing unit 2 may be carried out in a temperature range from 200 to 800° C. To efficiently make the reaction, it is preferable to increase the temperature to 250° C. or higher. Further, for the speed of the reaction, it is preferable to maintain the temperature to be equal to or lower than 600° C.

As the Ti precursor gas, $TiCl_3$ gas or $TiCl_2$ gas may be produced in the reaction between the chlorine containing gas and Ti.

In the case of using $TiCl_4$ gas as the chlorine containing gas, $TiCl_3$ gas may be produced as the Ti precursor gas by the following Eq. 1:

$$Ti+3TiCl_4 \rightarrow 4TiCl_3 \qquad \text{Eq. 1}$$

Alternatively, $TiCl_2$ gas may be produced as the precursor gas by the following Eq. 2:

$$Ti+TiCl_4 \rightarrow 2TiCl_2 \qquad \text{Eq. 2}$$

Figure 3:
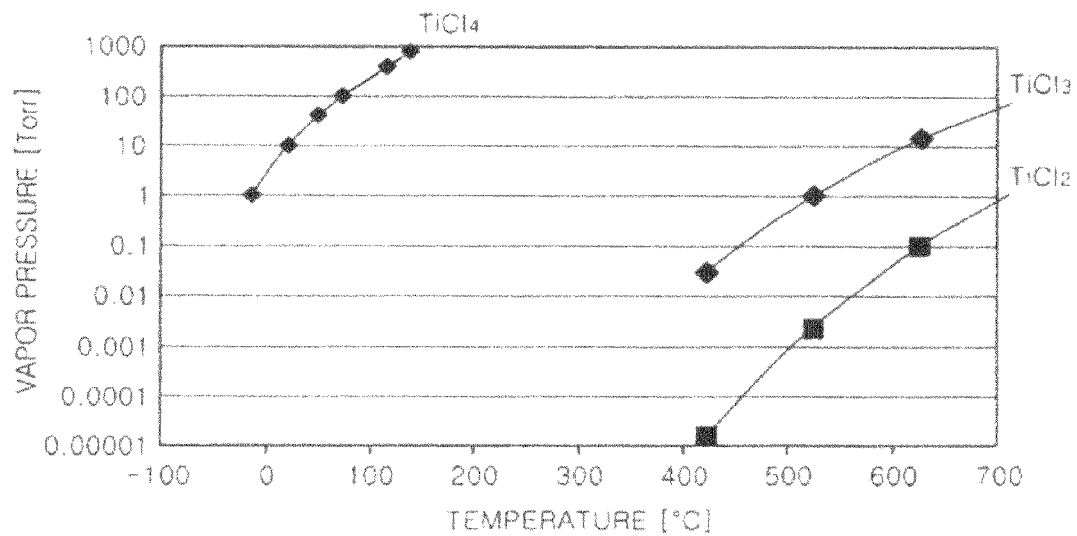
FIG. 3 shows vapor pressure curves of Ti chloride.

FIG. 3 shows vapor pressure curves of Ti chloride. As shown in FIG. 3, as the coordination number of Cl becomes smaller, the vapor pressure becomes lower. Accordingly, the vapor pressure is higher in $TiCl_3$ than in $TiCl_2$. The vapor pressure of $TiCl_3$ is substantially identical to the partial pressure of $TiCl_4$ in forming a Ti film by CVD in the conventional method. The melting point of $TiCl_2$ is 1035° C., while the melting point of $TiCl_3$ is 425° C. That is, the melting point of $TiCl_3$ is lower than that of $TiCl_2$. Therefore, $TiCl_3$ is more easily gasified than $TiCl_2$, whereby it is easier to perform the gas-phase supply to the wafer W. Accordingly, it is preferable to use $TiCl_3$.

Preferably, the $TiCl_3$ generation reaction of Eq. 1 is carried out in a temperature range from 425 to 500° C. If the temperature exceeds 500° C., $TiCl_3$ is thermally decomposed into $TiCl_2$ and $TiCl_4$ as in Eq. 3. Further, when the temperature is lower than 425° C., being lower than the melting point of $TiCl_3$, it is difficult to produce the $TiCl_3$ gas.

$$2TiCl_3 \rightarrow TiCl_2+TiCl_4 \qquad \text{Eq. 3}$$

Figure 4:
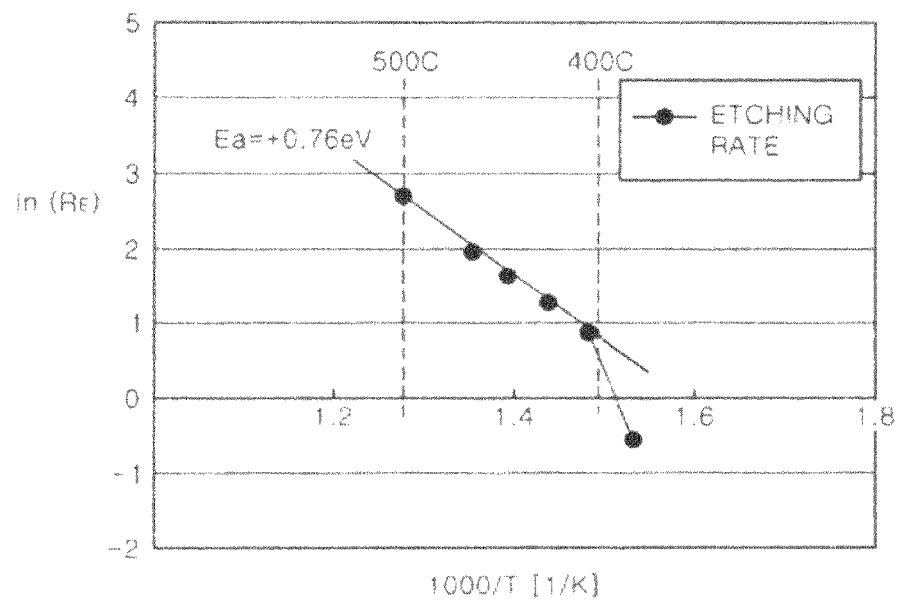
FIG. 4 shows temperature dependency of a Ti etching rate in $TiCl_3$ generation reaction.

The temperature dependency of the $TiCl_3$ generation reaction is shown in FIG. 4. The graph of FIG. 4 is obtained by setting up the inverse number of absolute temperature $T \times 1000$ to the horizontal axis and logarithm of the speed (etching rate) $R_E$ of the reaction to the vertical axis and plotting the etching rate at each temperature by the Arrhenius equation. As shown in FIG. 4, a straight line is obtained in the temperature range from 500 to 400° C. to indicate a constant activation energy Ea (=+0.76 eV). However, it is seen that the etching rate is decreased if the temperature becomes lower than about 400° C.

For example, the Ti containing unit 2 is heated and controlled to be maintained at a desired temperature, thereby securing the reaction temperature.

When the reaction temperature exceeds 500° C., $TiCl_2$ may be produced as the Ti precursor by Eq. 2. The Eq. 2 is acquired by the mixed reaction of Eqs. 1 and 3. Specifically, $TiCl_3$ produced by the reaction between $TiCl_4$ and Ti is thermally decomposed into $TiCl_2$.

When the Ti precursor is supplied to the wafer W and Ti is produced by the thermal decomposition, the temperature of the wafer W may be set in the range from 200 to 800° C., or preferably in the range from 350 to 700° C.

Further, when the Ti precursor is supplied to the wafer W and Ti is produced by the thermal decomposition, it is preferable to adsorb $TiCl_2$ onto the wafer W. Since it is difficult to adsorb $TiCl_3$ onto Si and separate Cl therefrom, it is hard to produce Ti by adsorbing $TiCl_3$ onto the wafer W and thermally decomposing it. Since, however, $TiCl_2$ is more easily adsorbed onto Si than $TiCl_3$ as can be shown by a quantum chemical calculation and the coordination number of Cl is small, it is easier to separate Cl. Besides, $TiCl_2$ has higher reactivity with respect to Si than $TiCl_3$, whereby it is easier to produce $TiSi_x$.

In this regard, when Ti is produced, it is preferable to increase the temperature of the wafer W to be higher than 500° C., at which $TiCl_3$ is thermally decomposed into $TiCl_2$. That is, in case that the temperature exceeds 500° C., even when $TiCl_3$ gas is supplied onto the wafer W, $TiCl_3$ is thermally decomposed into $TiCl_2$ and, thus, $TiCl_2$ is adsorbed. Of course, when $TiCl_2$ gas is supplied, the supplied $TiCl_2$ gas is adsorbed. More preferably, the wafer W is heated in the temperature range from higher than 500 to 650° C.

Figure 5:
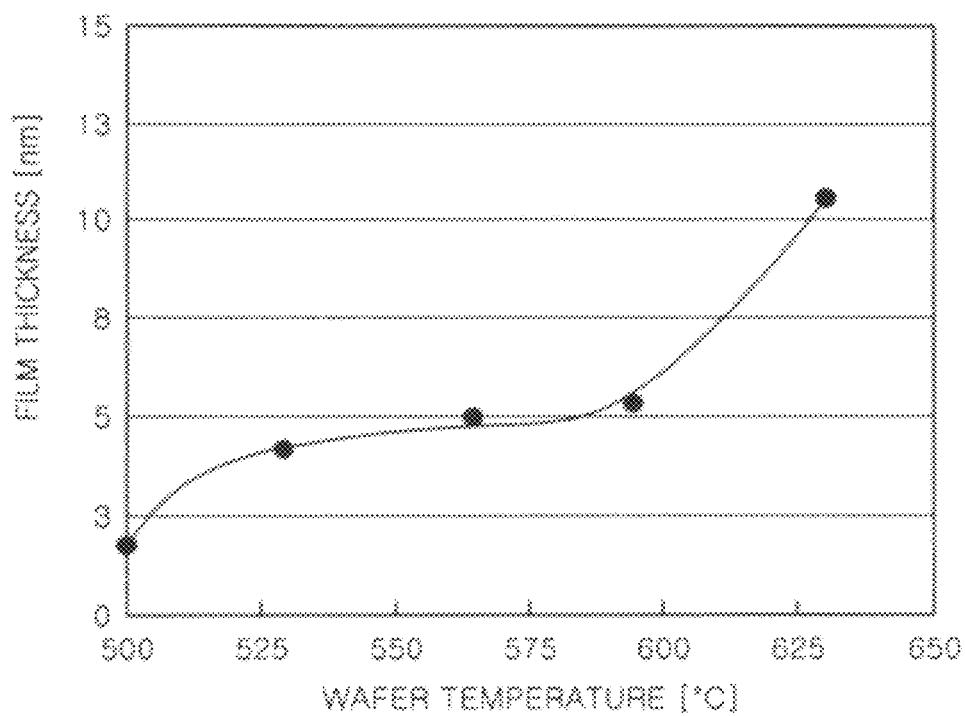
FIG. 5 shows temperature dependency of a film thickness of a $TiSi_2$ film when Ti is deposited on a Si portion of a wafer.

FIG. 5 shows temperature dependency of a film thickness of a $TiSi_2$ film when Ti is deposited on a Si portion of a wafer. As shown in FIG. 5, it is seen that the film thickness of the $TiSi_2$ film is rapidly decreased at the temperature of about 500° C. or lower. On the other hand, when the temperature exceeds 600° C., the film thickness becomes increased.

In the conventional method, $TiCl_4$ is used as a film forming source in the forming a Ti film. Since the bond energy of $TiCl_4$ is 17.32 eV that is relatively high, a plasma is required to decompose $TiCl_4$ and produce Ti. In contrast, the absolute value of the bond energy of $TiCl_3$ or $TiCl_2$ is smaller than that of $TiCl_4$, wherein the bond energy of $TiCl_2$ is 9.42 eV. For that reason, it is possible to produce Ti by the thermal reaction without using the plasma required in the case of supplying TiCl$_4$ as the precursor. Accordingly, it is possible to form a Ti film or a TiSi$_x$ film without generating the plasma damage.

As the processing gas supplied to the chamber 1, a single chlorine containing gas or a mixed gas in which an additional gas such as a reaction accelerating gas, a carrier gas or the like is added to the chlorine containing gas may be used. For example, in the case of using TiCl$_4$ gas as the chlorine containing gas, H$_2$ gas as the reaction accelerating gas or an inert gas, e.g., Ar gas as the carrier gas may be added thereto. Alternatively, H$_2$ gas and the carrier gas may be added together to TiCl$_4$ gas. By adding H$_2$ gas, it is possible to separate Cl of TiCl$_2$ adsorbed onto the wafer W at a much lower energy, accelerating the formation of the Ti film. Further, by adding H$_2$ gas, TiCl$_2$H$_x$ is produced and, thus, it is possible to decrease the absolute value of the bond energy to be much lower than that of TiCl$_2$, accelerating the formation of the Ti film.

The Ti containing unit 2 may be arranged at any position in the supply path 3 as long as the Ti precursor such as TiCl$_3$ gas, TiCl$_2$ gas or the like can be produced by allowing the chlorine containing gas such as TiCl$_4$ gas or the like to be in contact therewith. For example, the Ti containing unit 2 may be arranged in a pipe through which the chlorine containing gas is supplied or in a gas introduction unit, e.g., a shower head, for introducing the chlorine containing gas into the chamber 1. Further, the Ti containing unit 2 may have various shapes, e.g., a film shape and a bulk shape.

Although the Ti containing unit 2 is typically formed of a Ti single body, the Ti containing unit 2 may be a mixture or a compound of Ti and other substances as long as the Ti precursor gas such as TiCl$_3$ gas, TiCl$_2$ gas or the like can be produced.

Figure 6:
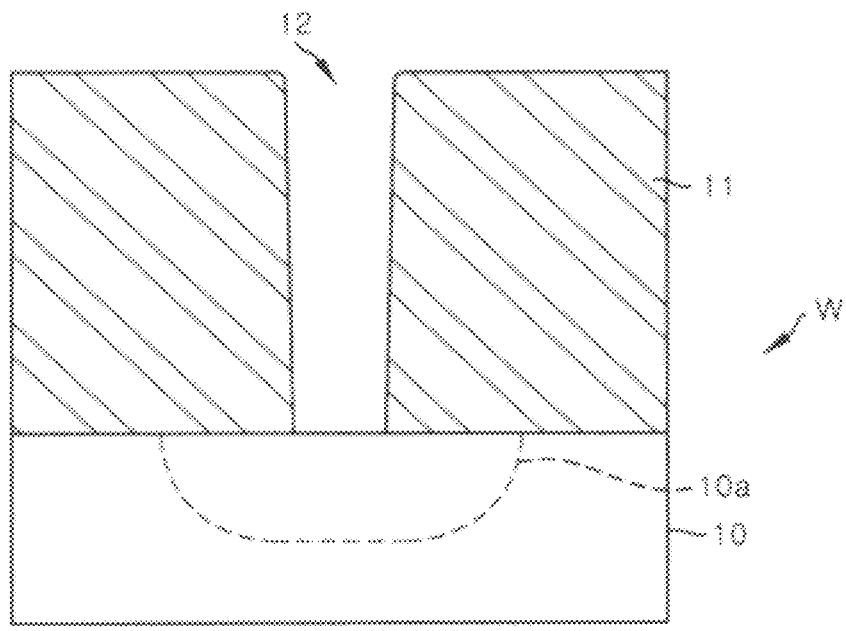
FIG. 6 is a cross sectional view showing an example of a structure of a wafer that is used in the Ti film forming method in accordance with an embodiment of the present invention.
Figure 7:
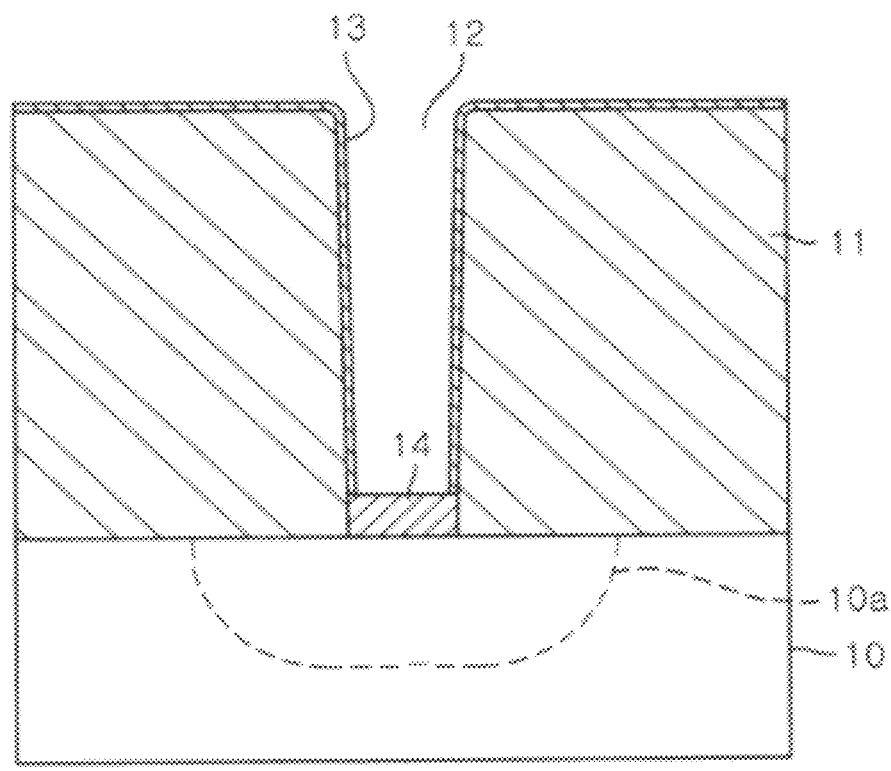
FIG. 7 is a cross sectional view schematically showing the wafer in which a contact layer is formed on a bottom portion of a contact hole.

For example, as shown in FIG. 6, the wafer W in which an interlayer dielectric film 11 is formed on a Si substrate 10 and a contact hole 12 extended to an impurity diffusion area 10a of the Si substrate 10 is formed in the interlayer dielectric film 11 may be used. By forming a Ti film 13 on the wafer W having such structure, a contact layer 14 formed of TiSi$_x$, e.g., TiSi$_2$, produced by the reaction between Ti and the underlying Si, is formed at a bottom portion of the contact hole 12 as shown in FIG. 7.

Figure 8:
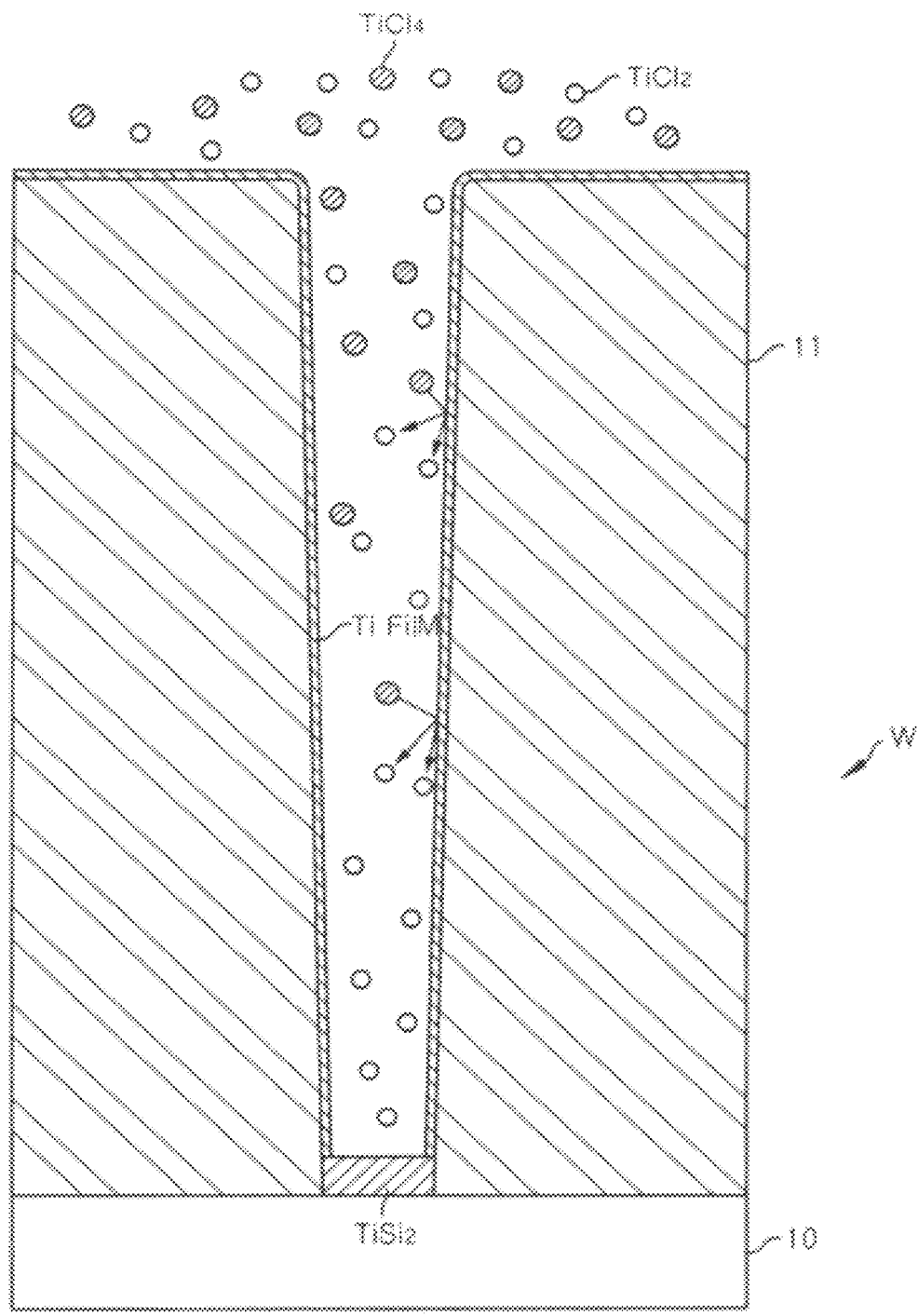
FIG. 8 schematically shows the wafer when a Ti film is formed in a contact hole by using the Ti film forming method in accordance with the present invention.

In the case of using TiCl$_4$ as the chlorine containing gas for the film formation, unreacted TiCl$_4$ and TiCl$_2$ into which TiCl$_3$ as the Ti precursor is thermally decomposed around the wafer W reach the wafer W as shown in FIG. 8. For that reason, even though Ti is produced by thermally decomposing TiCl$_2$, the produced Ti is etched by the unreacted TiCl$_4$. Accordingly, a thinner Ti film is formed as compared with the conventional film forming method using a plasma.

However, since TiCl$_4$ is gradually consumed inside the contact hole 12, the amount of TiCl$_4$ is decreased while the amount of TiCl$_2$ is increased at a portion closer to the bottom portion of the contact hole 12 and, thus, a TiSi$_2$ film having the same thickness as that of the conventional film forming method is formed at the bottom portion of the contact hole 12. At a sidewall of the contact hole 12, Ti is also etched by the unreacted TiCl$_4$. Since, however, there exists less amount of TiCl$_4$, the etched amount of Ti is smaller than that at an upper surface of the interlayer dielectric film 11 and, thus, a Ti film having a thickness thicker than that at the upper surface thereof is formed.

In the case of using the conventional film forming method, it is difficult to form a Ti film at the sidewall of the contact hole. Accordingly, a thicker Ti film is formed at the sidewall of the contact hole 12 as compared with the conventional film forming method. As a result, it is possible to form a Ti film with more satisfactory step coverage as compared with the conventional film formation of a Ti film.

Further, when the target film to be formed is not a TiSi$_x$ film but a Ti film, a nitriding process may be performed on the formed Ti film in view of preventing the Ti film from being oxidized or peeled off and the like as in the conventional process for forming a Ti film.

Figure 9:
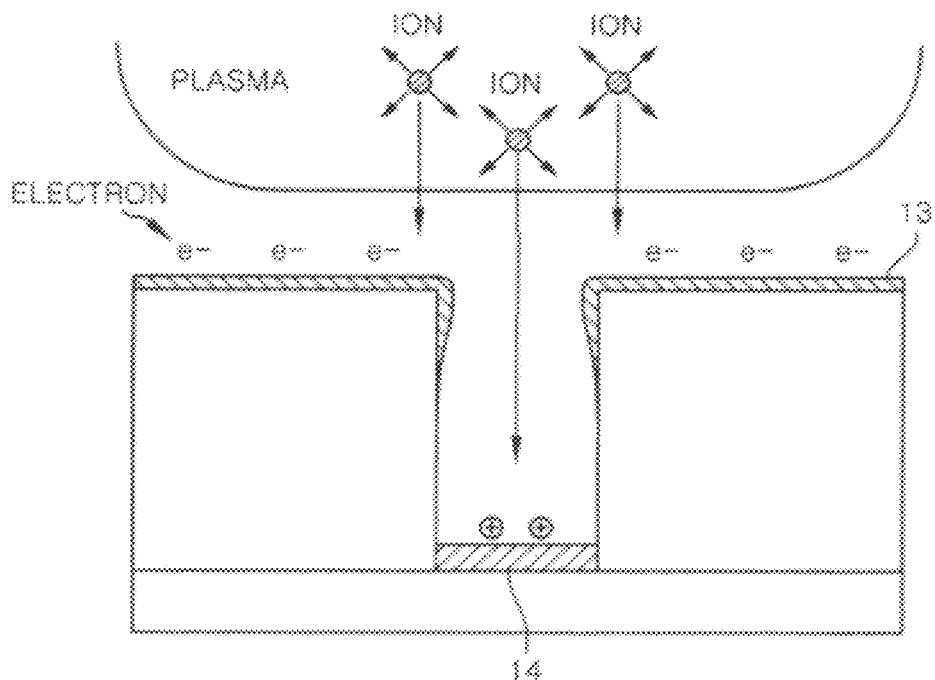
FIG. 9 is a cross sectional view schematically showing a film forming state of a contact hole when a Ti film is conventionally formed by using a plasma.

In the conventional method for forming a Ti film by using a plasma, a thinner Ti film or no Ti film may be formed at a sidewall of the contact hole depending on film forming conditions as shown in FIG. 9. In this case, the Ti film 13 formed on the upper surface of the interlayer dielectric film 11 is insulated from the contact layer 14 formed of TiSi$_x$ formed at the bottom portion of the contact hole 12 and, thus, no electrons go into the contact hole 12 and the charges of ions in the plasma are gathered at the bottom portion of the contact hole 12. Accordingly, devices may be damaged by the electron shading effect (plasma damage).

Figure 10:
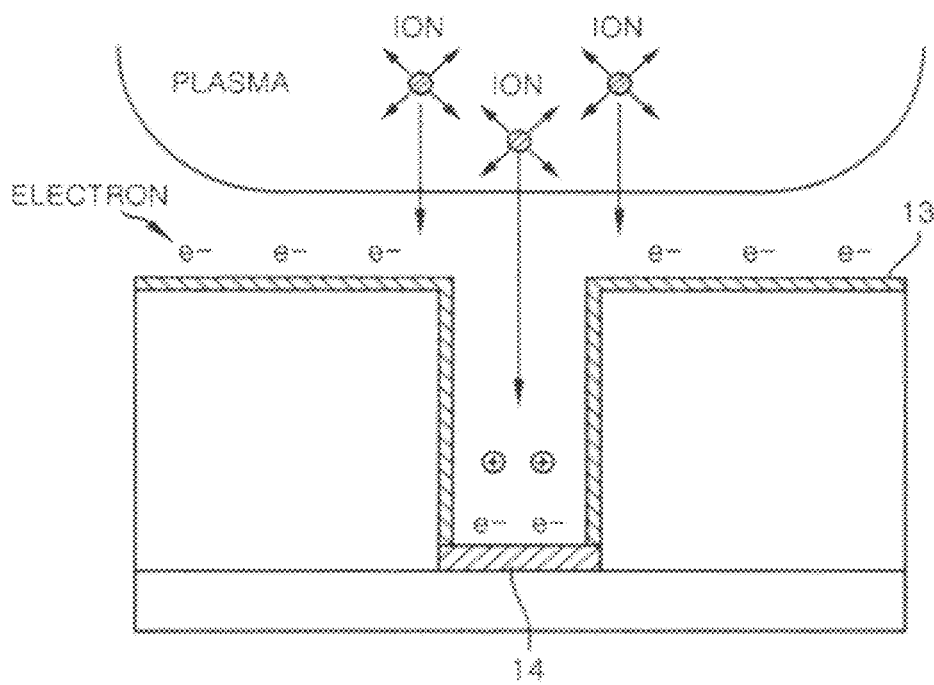
FIG. 10 is a cross sectional view schematically showing a film forming state of a contact hole when a Ti film is formed by using the Ti film forming method in accordance with the present invention.

On the other hand, when a Ti film is formed by the thermal reaction of the Ti precursor produced in the reaction of Ti and the chlorine containing gas such as TiCl$_4$ gas or the like, the Ti film 13 is formed on the sidewall of the contact hole 12 as shown in FIG. 10. Accordingly, the Ti film 13 formed on the upper surface of the interlayer dielectric film 11 becomes conductive with the contact layer 14 formed of TiSi$_x$ formed at the bottom portion of the contact hole 12. For that reason, even when the plasma is generated, electrons flow at the bottom portion of the contact hole 12 and the charges of ions are annihilated therearound. As a result, there hardly occurs any plasma damage.

In this situation, the Ti film formation may be carried out first halfway by the thermal reaction of the Ti precursor and in succession by using a plasma. As a result, it is possible to accelerate the film formation without causing the plasma damage. Further, the film formation may be performed by repeatedly using the heat and the plasma.

Next, a detailed embodiment of the present invention will be described.

In the detailed embodiment, an example in which the present invention is embodied by using the conventional film forming apparatus for forming a Ti film will be described.

Figure 11:
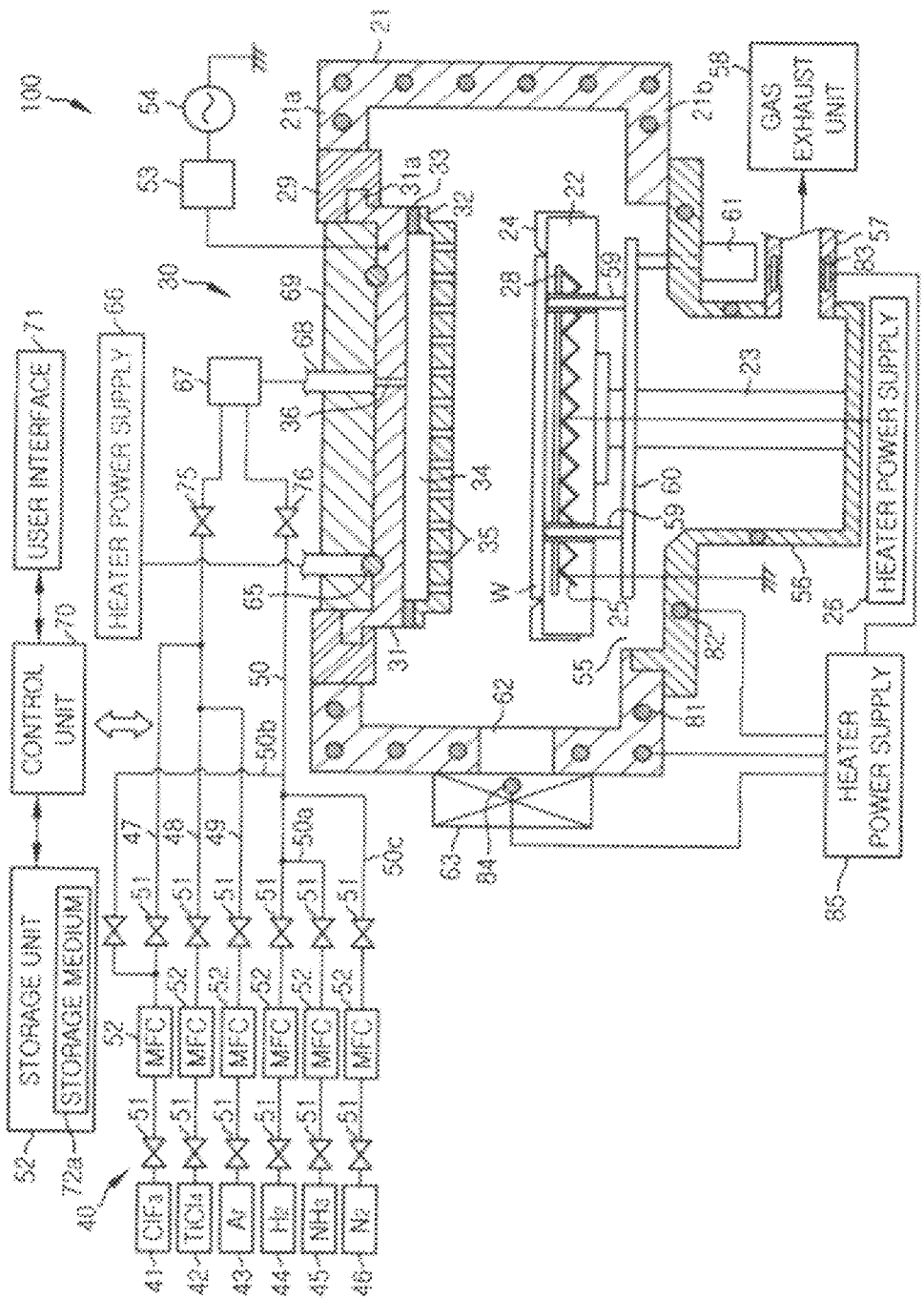
FIG. 11 is a cross sectional view showing a schematic structure of a film forming apparatus that is used for a detailed embodiment of the present invention.

FIG. 11 is a cross sectional view showing a schematic structure of the film forming apparatus that is used for the detailed embodiment of the present invention. The film forming apparatus 100 includes a substantially cylindrical chamber 21. In the chamber 21, a susceptor 22 formed of AlN is arranged while being supported by a supporting member 23 centrally provided below the susceptor 22. The susceptor 22 serves as a mounting table (stage) for horizontally supporting a Si wafer W as a target substrate to be processed.

A guide ring 24 for guiding the wafer W is provided at an outer peripheral portion of the susceptor 22. Further, a heater 25 formed of a high-melting point metal, e.g., molybdenum is buried in the susceptor 22. The wafer W as the target substrate is heated to a predetermined temperature by the heater 25 powered from a heater power source 26. In the susceptor 22, an electrode 28 as a bottom electrode of the parallel plate electrodes is buried close to the top surface of the susceptor 22. The electrode 28 is grounded.

A pre-mix type shower head 30 is provided to a ceiling wall of the chamber 21, wherein the shower head 30 serves as a gas introduction unit for introducing a gas through a gas line and also as an upper electrode of the parallel plate electrodes. The shower head 30 includes a base member 31 and a shower plate 32. An outer peripheral portion of the shower plate 32 is fixed to the base member 31, by using screws (not shown), via an annular intermediate member 33 for preventing the adhesiveness.

The shower plate 32 has a flange shape and includes a recessed portion therein. A gas diffusion space 34 is defined between the base member 31 and the shower plate 32. A flange 31a is formed at an outer periphery of the base member 31, and the flange 31a is supported by an insulation member 29. The shower plate 32 includes a plurality of gas injection holes 35, and a gas inlet hole 36 is formed at a central portion of the base member 31.

The gas inlet hole 36 is connected to a gas line of a gas supply unit 40.

The gas supply unit 40 includes a $ClF_3$ gas supply source 41 for supplying $ClF_3$ gas serving as a cleaning gas; a $TiCl_4$ gas supply source 42 for supplying $TiCl_4$ gas serving as a Ti compound gas; an Ar gas supply source 43 for supplying Ar gas; a $H_2$ gas supply source 44 for supplying $H_2$ gas serving as a reducing gas; a $NH_3$ gas supply source 45 for supplying $NH_3$ gas serving as a nitriding gas; and a $N_2$ gas supply source 46 for supplying $N_2$ gas. $ClF_3$ gas supply lines 47 and 50b, a $TiCl_4$ gas supply line 48, an Ar gas supply line 49, a $H_2$ gas supply line 50, a $NH_3$ gas supply line 50a and a $N_2$ gas supply line 50c are respectively connected to the $ClF_3$ gas supply source 41, the $TiCl_4$ gas supply source 42, the Ar gas supply source 43, the $H_2$ gas supply source 44, the $NH_3$ gas supply source 45, the nitriding gas and the $N_2$ gas supply source 46. In each of the gas lines, a mass flow controller 52 and two valves 51 are provided. Further, the mass flow controller 52 is placed between the two valves 51.

Connected to the $TiCl_4$ gas supply line 48 extended from the $TiCl_4$ gas supply source 42 are the $ClF_3$ gas supply line 47 extended from the $ClF_3$ gas supply source 41 and the Ar gas supply line 49 extended from the Ar gas supply source 43. Connected to the $H_2$ gas supply line 50 extended from the $H_2$ gas supply source 44 are the $NH_3$ gas supply line 50a extended from the $NH_3$ gas supply source 45, the $N_2$ gas supply line 50c extended from the $N_2$ gas supply source 46 and the $ClF_3$ gas supply line 50b extended from the $ClF_3$ gas supply source 41.

The $TiCl_4$ gas supply line 48 and the $H_2$ gas supply line 50 are connected to a gas mixing unit 67, and a mixed gas made in the gas mixing unit 67 flows to the gas inlet hole 36 through a gas line 68. Then, the mixed gas reaches the gas diffusion space 34 through the gas inlet hole 36 and injected to the wafer W inside the chamber 21 through the gas injection holes 35 of the shower plate 32. Further, valves 75 and 76 are respectively provided at upstream sides of the gas mixing unit 67 in the $TiCl_4$ gas supply line 48 and the $H_2$ gas supply line 50.

A high frequency power source 54 is connected to the shower head 30 via a matcher 53 such that a high frequency power is supplied from the high frequency power source 54 to the shower head 30. By supplying a high frequency power from the high frequency power source 54, a gas supplied to the chamber 21 via the shower head 30 is converted to a plasma, to thereby perform the film formation.

A heater 65 is provided in the base member 31 of the shower head 30. A heater power supply 66 is connected to the heater 65. The shower head 30 is heated to a desired temperature by the heater 65 powered from the heater power supply 66. An insulting member 69 is provided at a recessed portion formed at an upper portion of the base member 31 to increase the heating efficiency of the heater 65.

A circular hole 55 is formed at a central portion of a bottom wall 21b of the chamber 21. Provided on the bottom wall 21b is a gas exhaust room 56 downwardly protruding to cover the circular hole 55. A gas exhaust pipe 57 is connected to a side of the gas exhaust room 56, and a gas exhaust unit 58 is connected to the gas exhaust pipe 57. By operating the gas exhaust unit 58, the chamber 21 can be depressurized to a predetermined vacuum level.

Provided in the susceptor 22 are three wafer supporting pins 59 that are upwardly and downwardly movable with regard to the surface of the susceptor 22 to move the wafer W up and down while supporting it. In FIG. 11, only two of the wafer supporting pins 59 are shown. The wafer supporting pins 59 are supported by a supporting plate 60. The supporting pins 59 are upwardly and downwardly moved through the supporting plate 60 by a driving mechanism 61 such as air cylinder or the like.

Provided in a sidewall of the chamber 21 are a loading/unloading port 62 for loading and unloading the wafer W between the chamber 21 and a transfer chamber (not shown) provided adjacent to the chamber 21; and a gate valve 63 for opening and closing the loading/unloading port 62.

Heaters 81 to 84 are respectively buried in the walls of the chamber 21 and the gas exhaust room 56, the gas exhaust pipe 57 and the gate valve 63. A heater power supply 85 is connected to the heaters 81 to 84. The walls of the chamber 21 and the gas exhaust room 56, the gas exhaust pipe 57 and the gate valve 63 are respectively heated to predetermined temperatures by the heaters 81 to 84.

The heaters power supplies 26 and 66, the valve 51, the mass flow controller 52, the matcher 53, the high frequency power source 54, the driving unit 61, and the like, being elements of the film forming apparatus 100, are connected to and controlled by a control unit 70 including a microprocessor (computer). Connected to the control unit 70 is a user interface 71 including a keyboard and/or a touch panel through which a user performs a command input and the like to manage the film forming apparatus 100, a display unit for visually displaying an operating status of the film forming apparatus 100.

Additionally connected to the control unit 70 is a storage unit 72 for storing a processing recipe, i.e., a program for performing the processing in each unit of the film forming apparatus 100. The processing recipe is stored in a storage medium 72a of the storage unit 72. The storage medium 72a may be a fixed unit such as hard disk or the like, or a portable unit such as CDROM, DVD or the like. Further, the recipe may be adequately transmitted from another device through, e.g., a dedicated line. As necessary, by calling a processing recipe from the storage unit 72 and executing it in the control unit 70 depending on an instruction or the like transferred from the user interface 71, a desired process is carried out in the film forming apparatus 100 under the control of the control unit 70.

Figure 12:
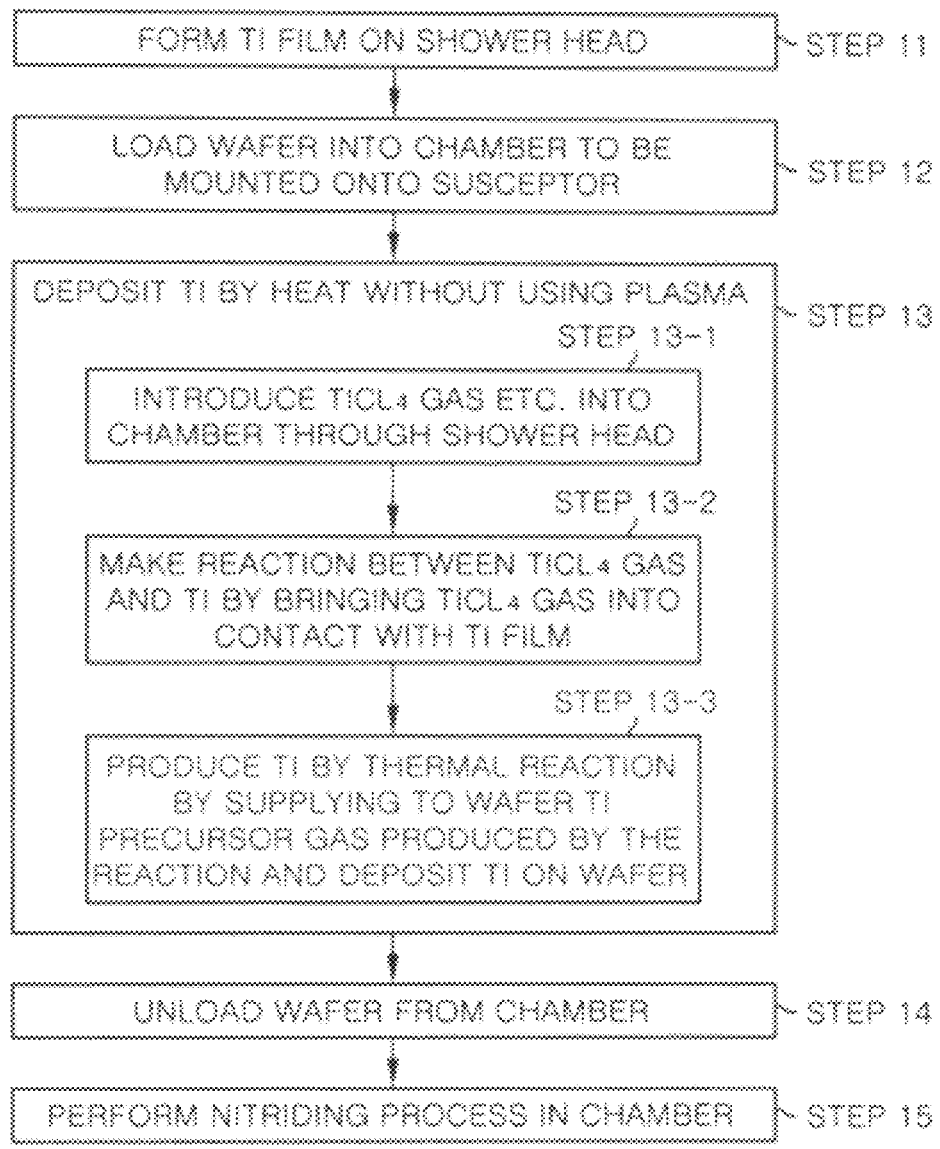
FIG. 12 is a flowchart showing a Ti film forming method that is executed in the film forming apparatus shown in FIG. 11.
Figure 13:
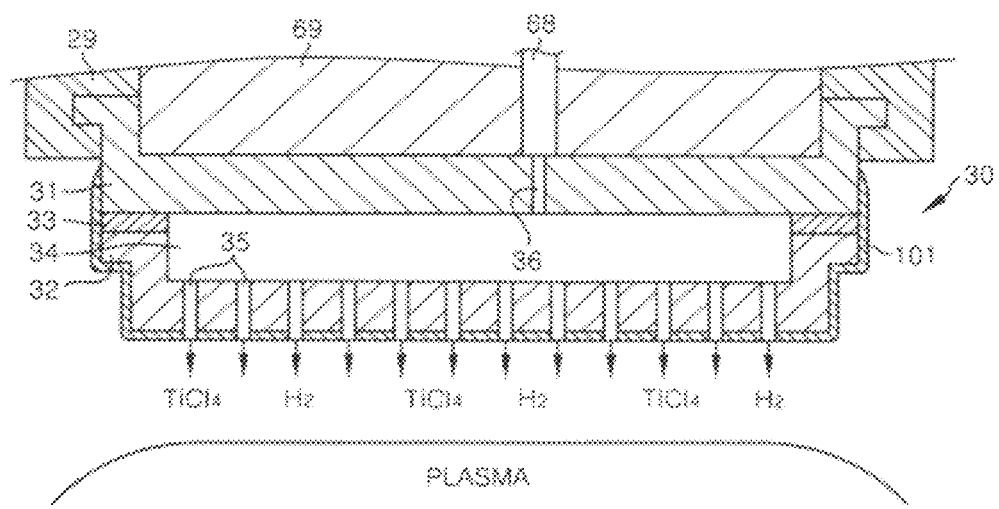
FIG. 13 is a cross sectional view showing a shower head in which a Ti film is formed.

Next, a Ti film forming method of the present embodiment in the film forming apparatus 100 will be described with reference to a flowchart shown in FIG. 12.

First, before the wafer W is loaded, a Ti film forming process is performed on the shower head 30 under the state where no wafer W exists in the chamber 21 (step 11). The Ti film forming process on the shower head 30 is a process for forming a Ti containing unit to be used in the case of the Ti film formation of the wafer W and performed under the same conditions as those in the case of the conventional Ti film forming method using a plasma.

Specifically, by applying a high frequency power from the high frequency power source 54 to the shower head 30 while supplying $TiCl_4$ gas, $H_2$ gas and Ar gas serving as the carrier gas to the chamber 21 whose inside is maintained to a vacuum level through the shower head 30, the gases are converted to a plasma, to thereby form a Ti film 101 on the surface (external surface) of the shower head 30. At this time, the temperature of the shower head 30 ranges from the 200 to 620° C., or preferably from 400 to 620° C. For example, the temperature of the shower head 30 is set to 480° C. In this case, since the film thickness of the Ti film to be formed on the shower head 30 is significantly varied depending on the temperature of the shower head 30, it is preferable to control the temperature variation of the shower head 30 within 30° C., e.g., in the range from 450 to 480° C., such that the film thickness of the Ti film is not significantly varied. Further, in the present embodiment, the temperature of the shower head 30, which is the temperature on the surface of the shower head 30, is controlled by adjusting the setting temperature of the heater 65.

Other conditions in step 11 preferably have the following ranges:
i) High frequency power supplied from high frequency power source 54
Frequency: 300 kHz to 27 MHz
Magnitude: 100 to 1500 W
ii) $TiCl_4$ gas flow rate
300 mm wafer: 1 to 100 mL/min (sccm), preferably 4 to 50 mL/min (sccm)
Per unit area: $1.415 \times 10^{-5}$ to $1.415 \times 10^{-3}$ mL/min/mm$^2$ (sccm/mm$^2$), preferably $5.66 \times 10^{-5}$ to $7.075 \times 10^{-4}$ mL/min/mm$^2$ (sccm/mm$^2$)
iii) Ar gas flow rate
300 mm wafer: 100 to 2000 mL/min (sccm), preferably 500 to 1800 mL/min (sccm)
Per unit area: $1.415 \times 10^{-3}$ to $2.831 \times 10^{-2}$ mL/min/mm$^2$ (sccm/mm$^2$), preferably $7.077 \times 10^{-3}$ to $2.547 \times 10^{-2}$ mL/min/mm$^2$ (sccm/mm$^2$)
iv) $H_2$ gas flow rate
300 mm wafer: 250 to 5000 mL/min (sccm), preferably 2000 to 5000 mL/min (sccm)
Per unit area: $3.539 \times 10^{-3}$ to $7.077 \times 10^{-2}$ mL/min/mm$^2$ (sccm/mm$^2$), preferably $2.831 \times 10^{-2}$ to $7.077 \times 10^{-2}$ mL/min/mm$^2$ (sccm/mm$^2$)
v) Pressure inside chamber: 400 to 1333 Pa (3 to 10 Torr), preferably 400 to 1067 Pa (3 to 8 Torr).

In addition, the film forming time may be adequately set depending on the film thickness of a film to be formed. For example, when the film forming time is set in the range from 15 to 90 sec, the film thickness in the range from 4 to 20 nm is obtained.

Next, the chamber 21 is purged after stopping the supply of the gases and stopping the conversion of the plasma by turning off the high frequency power source 54 and, then, the wafer W is loaded into the chamber 21 through the gate value 63 by using a transfer mechanism (not shown) to be mounted onto the susceptor 22 (step 12). For example, the wafer W has the structure shown in FIG. 6 in which the interlayer dielectric film 11 is formed on the Si substrate and the contact hole 12 extended to the impurity diffusion area 10a of the Si substrate 10 is formed in the interlayer dielectric film 11.

Next, Ti is deposited on the surface of the wafer W by using heat without using the plasma (step 13).

In step 13, $TiCl_4$ gas serving as the chlorine containing gas, $H_2$ gas serving as the reaction accelerating gas and Ar gas serving as the carrier gas are introduced, through the shower head 30, into the chamber 21 whose inside is maintained at a vacuum level (step 13-1).

Figure 14:
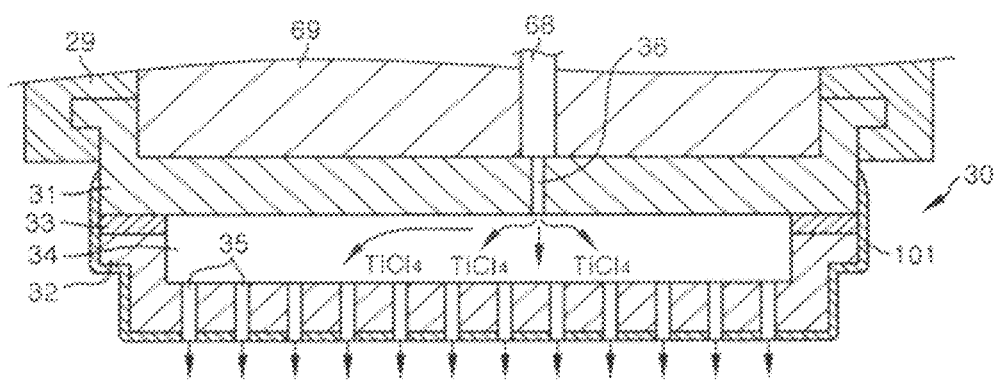
FIG. 14 is a cross sectional view schematically showing a shower head in which a Ti film is formed and $TiCl_4$ gas is brought into contact with the formed Ti film.

The gases are injected into the chamber 21 through the gas injection holes 35 formed in the shower plate 32. Since the Ti film 101 serving as the Ti containing unit has been formed on the surface (external surface) of the shower head 30, when the gases are injected through the gas injection holes 35, the $TiCl_4$ gas serving as the chlorine containing gas is brought into contact with the Ti film 101 so that the $TiCl_4$ gas reacts with Ti, as shown in FIG. 14 (step 13-2). In other words, the Ti film 101 serving as the Ti containing unit is formed in the supply path of the $TiCl_4$ gas and, thus, the $TiCl_4$ gas is brought into contact with the Ti film 101 when the $TiCl_4$ gas is supplied to the chamber 21, whereby the reaction between the $TiCl_4$ gas and the Ti film 101 is made.

The reaction may be made in the temperature range from 200 to 800° C., preferably 400 to 600° C. Accordingly, it is preferable to heat the shower head 30 such that the temperature of the shower head 30 ranges from 400 to 600° C.

By the reaction, the Ti precursor gas is produced. In the case of using the $TiCl_4$ gas as the chlorine containing gas as in the present embodiment, $TiCl_3$ gas or $TiCl_2$ gas is produced by Eq. 1 or 2 as described above. As described above, $TiCl_3$ is more easily gasified than $TiCl_2$, which makes it easier to supply $TiCl_3$ in the gas-phase to the wafer W. Accordingly, $TiCl_3$ gas is preferable.

To that end, it is preferable to heat the shower head 30 by using the heater 65 in the temperature range from 425 to 500° C., which is preferable for the $TiCl_3$ generation reaction of Eq. 1. In the meantime, in the case of producing $TiCl_2$ as the Ti precursor, it is preferable to heat the shower head to be higher than 500° C.

At this time, since the etching rate of the Ti film 101 by the reaction with $TiCl_4$ is significantly varied depending on the temperature of the shower head 30, it is preferable to control the temperature variation of the shower head 30 within 30° C., e.g., in the range from 450 to 480° C., such that the etching rate thereof is not significantly varied. Further, in the present embodiment, the temperature of the shower head 30 is also the temperature on the surface of the shower head 30.

Preferably, the temperature of the shower head 30 is set to be identical to that in the case of forming the Ti film 101 in step 11 and making the reaction between the $TiCl_4$ gas and the Ti film 101 in step 13-2. It is also preferable to control the temperature of the shower head 30 in the temperature range between 425 to 500° C., which is the preferable temperature range in step 13-2.

The Ti precursor gas produced by the reaction between $TiCl_4$ gas and the Ti film 101 is supplied to the wafer W that has been heated to a predetermined temperature, whereby Ti is produced by the thermal reaction and deposited on the wafer W (step 13-3). Specifically, by heating the wafer W to a predetermined temperature by the heater 25 provided in the susceptor 22, Cl is separated from the Ti precursor reaching the wafer W by the thermal reaction and, thus, Ti is produced without using a plasma, whereby the Ti film is formed on the wafer W (step 13-3). The deposited Ti becomes a Ti film as it is or a TiSi film by the reaction with Si of an underlying Si layer (Si or polysilicon substrate) under a predetermined condition.

At this time, the temperature of the wafer W may be set in the range from 200 to 800° C., preferably 350 to 700° C.

As described above, when Ti is produced by the thermal reaction, it is preferable to adsorb $TiCl_2$ onto the wafer W since $TiCl_2$ is more easily adsorbed onto Si than $TiCl_3$, Cl is more easily separated from $TiCl_2$ than $TiCl_3$, and $TiCl_2$ has higher reactivity with respect to Si than $TiCl_3$. In this regard, it is preferable to increase the temperature of the wafer W to be higher than 500° C., at which $TiCl_2$ is easily produced.

In case that the temperature exceeds 500° C., even when $TiCl_3$ gas is supplied to the wafer W, $TiCl_3$ gas is thermally decomposed into $TiCl_2$ gas and, thus, $TiCl_2$ is adsorbed. More preferably, the wafer W is heated in the temperature range from more than 500 to 650° C. Since the temperature of the wafer W is typically unable to be measured in a direct manner, it is read by measuring the temperature of the susceptor. Although the relationship between the temperatures of the susceptor and the wafer is varied depending on various conditions such as the pressure inside the chamber, the wafer has a lower temperature than that of the susceptor by about 5 to 50° C.

From the above, it is preferable that, in step 13, the temperature of the shower head 30 is set in the range from 425 to 500° C. and $TiCl_3$ gas is mainly used as the Ti precursor gas; the $TiCl_3$ gas supplied to the wafer W is decomposed into $TiCl_2$ gas to be adsorbed onto the wafer W by increasing the temperature of the wafer W to be higher than 500° C.; and Cl is separated from $TiCl_2$ by the thermal reaction to produce Ti on the wafer W.

When Ti is produced in this way, it is preferable to supply $H_2$ gas as well as the Ti precursor gas. Accordingly, since Cl of the $TiCl_2$ gas adsorbed onto the wafer W can be separated as HCl by the following Eq. 4, it is possible to produce Ti at a lower energy, accelerating the deposition of Ti.

$$TiCl_2 + H_2 \rightarrow Ti + 2HCl \qquad \text{Eq. 4}$$

The other conditions in step 13 preferably have the following ranges:
i) $TiCl_4$ gas flow rate
   300 mm wafer: 1 to 100 mL/min (sccm), preferably 4 to 50 mL/min (sccm)
   Per unit area: $1.415 \times 10^{-5}$ to $1.415 \times 10^{-3}$ mL/min/mm$^2$ (sccm/mm$^2$), preferably $5.66 \times 10^{-5}$ to $7.075 \times 10^{-4}$ mL/min/mm$^2$ (sccm/mm$^2$)
ii) Ar gas flow rate
   300 mm wafer: 100 to 2000 mL/min (sccm), preferably 500 to 1800 mL/min (sccm)
   Per unit area: $1.415 \times 10^{-3}$ to $2.831 \times 10^{-2}$ mL/min/mm$^2$ (sccm/mm$^2$), preferably $7.077 \times 10^{-3}$ to $2.547 \times 10^{-2}$ mL/min/mm$^2$ (sccm/mm$^2$)
iii) $H_2$ gas flow rate
   300 mm wafer: 250 to 5000 mL/min (sccm), preferably 2000 to 5000 mL/min (sccm)
   Per unit area: $3.539 \times 10^{-3}$ to $7.077 \times 10^{-2}$ mL/min/mm$^2$ (sccm/mm$^2$), preferably $2.831 \times 10^{-2}$ to $7.077 \times 10^{-2}$ mL/min/mm$^2$ (sccm/mm$^2$)
iv) Pressure inside chamber: 1.33 to 1333 Pa (0.1 to 10 Torr), preferably 400 to 1067 Pa (3 to 8 Torr)

In addition, the film forming time may be adequately set depending on the film thickness of a film to be formed. For example, when the film forming time is set in the range from 1 to 90 sec, the film thickness in the range from 1 to 10 nm is obtained.

In this way, the Ti film or the $TiSi_x$ film is formed on the surface of the wafer W. Thereafter, the chamber 21 is purged after stopping the gas supply, and then the gate valve 63 is opened and the wafer W is unloaded from the chamber 21 by the transfer mechanism (not shown) (step 14).

Next, a nitriding process is carried out under the state where no wafer W exists in the chamber 21 (step 15). The nitriding process serves to prevent the Ti film formed on the surfaces of the shower head 30 and the susceptor 22 from being peeled off to generate particles.

In the nitriding process, $NH_3$ gas serving as a nitriding gas as well as $H_2$ gas and Ar gas are supplied while heating members (such as the chamber wall, the surface of the shower head and the like) inside the chamber 21; the processing mixed gas is converted to a plasma by supplying a high frequency power from the high frequency power source 54 to the shower head 30; and the surface of the Ti film formed on the inner surface of the chamber 21 and the surfaces of the shower head 30 and the susceptor 22 is nitrided.

The nitriding process preferably has the following conditions:
i) High frequency power supplied from high frequency power source 54
   Frequency: 300 kHz to 27 MHz
   Magnitude: 100 to 1500 W
ii) $NH_3$ gas flow rate
   300 mm wafer: 100 to 2000 mL/min (sccm)
   Per unit area: $1.415 \times 10^{-3}$ to $2.831 \times 10^{-2}$ mL/min/mm$^2$ (sccm/mm$^2$)
iii) Ar gas flow rate
   300 mm wafer: 100 to 2000 mL/min (sccm)
   Per unit area: $1.415 \times 10^{-3}$ to $2.831 \times 10^{-2}$ mL/min/mm$^2$ (sccm/mm$^2$)
iv) $H_2$ gas flow rate
   300 mm wafer: 250 to 5000 mL/min (sccm)
   Per unit area: $3.539 \times 10^{-3}$ to $7.077 \times 10^{-2}$ mL/min/mm$^2$ (sccm/mm$^2$)
v) Pressure inside chamber: 400 to 1333 Pa (3 to 10 Torr)
vi) Temperature of shower head: 250 to 600° C.
vii) Temperature of susceptor: 350 to 700° C.

The nitriding process can be carried out without using the plasma. In this case, the conditions preferably have the following ranges:
i) $NH_3$ gas flow rate
   300 mm wafer: 100 to 2000 mL/min (sccm)
   Per unit area: $1.415 \times 10^{-3}$ to $2.831 \times 10^{-2}$ mL/min/mm$^2$ (sccm/mm$^2$)
ii) Ar gas flow rate
   300 mm wafer: 100 to 2000 mL/min (sccm)
   Per unit area: $1.415 \times 10^{-3}$ to $2.831 \times 10^{-2}$ mL/min/mm$^2$ (sccm/mm$^2$)
iii) $H_2$ gas flow rate
   300 mm wafer: 250 to 5000 mL/min (sccm)
   Per unit area: $3.539 \times 10^{-3}$ to $7.077 \times 10^{-2}$ mL/min/mm$^2$ (sccm/mm$^2$)
iv) Pressure inside chamber: 1.33 to 1333 Pa (0.1 to 10 Torr)
v) Temperature of shower head: 250 to 600° C.
vi) Temperature of susceptor: 350 to 700° C.

As such, a series of steps for forming the Ti film on a wafer is completed. The steps 11 to 15 are repeatedly performed on a plurality of wafers. After the Ti film formation is performed on a predetermined number of wafers W, a cleaning process is carried out by introducing $ClF_3$ gas serving as a cleaning gas into the chamber 21 under the state in which no wafer W exists. Thereafter, a TiN film, for example, is pre-coated on the inside of the chamber 21, and such wafer processing steps are repeatedly carried out.

In accordance with the present embodiment, $TiCl_3$ gas or $TiCl_2$ gas, which is produced as the Ti precursor by the reaction made by bringing $TiCl_4$ gas serving as a chlorine containing gas into contact with the Ti film 101 formed on the surface of the shower head 30, is used for the wafer W mounted on the susceptor 22. Accordingly, Ti can be produced by separating Cl at a lower energy as compared with the case of producing $TiCl_4$ as the precursor. Therefore, Ti can be deposited only by the thermal reaction without using a plasma and, thus, it is possible to form a Ti film or a $TiSi_x$ film on the wafer W without causing the plasma damage.

Further, the Ti film is formed on the surface of the shower head 30 by using the same method as the conventional Ti film forming method, and Ti is deposited on the wafer W by producing the Ti precursor by the reaction between the Ti film formed on the surface of the shower head 30 and $TiCl_4$ conventionally serving as the film forming gas. Accordingly, it is possible to realize the Ti film or TiSi$_x$ film formation without using a plasma by using the conventional apparatus and gases.

Figure 15:
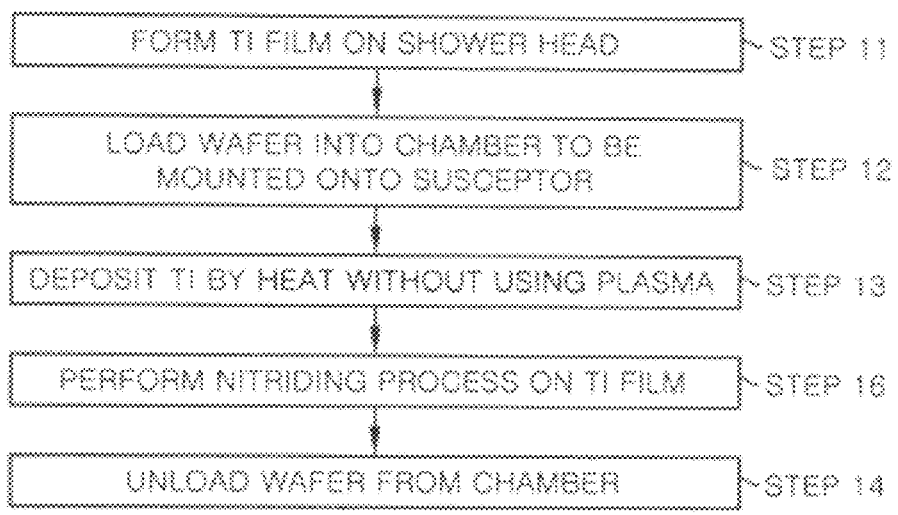
FIG. 15 is a flowchart for explaining the Ti film forming method that is executed in the film forming apparatus shown in FIG. 11 in accordance with the detailed embodiment of the present invention.

When the target film to be formed is not a TiSi$_x$ film but a Ti film, a nitriding process may be performed on the formed Ti film after the Ti deposition of step 13, in view of, e.g., preventing the Ti film from being oxidized or peeled off as described above. In this case, the film formation is shown in FIG. 15. Specifically, after the steps 11 to 13 are carried out as described above, the nitriding process of the Ti film is carried out in step 16 and, then, the step 14 in which the wafer W is unloaded is performed. As such, in case that the nitriding process is carried out after the film formation, it is not necessary to perform the step 15 in which the nitriding process is carried out on the inside of the chamber 21. The nitriding process of step 16 may be carried out under the same conditions as those in the case of performing the nitriding process on the shower head 30 and the like in step 15.

Further, as described above, in the case of the film forming method of the present embodiment, it is possible to form a Ti film on a contact hole with more satisfactory step coverage. The Ti film is sufficiently formed on a sidewall of the contact hole and, thus, plasma damage due to the shading effect is not caused even if the plasma is generated after the Ti film is formed on the surface of the wafer W during a period of time in step 13.

Figure 16:
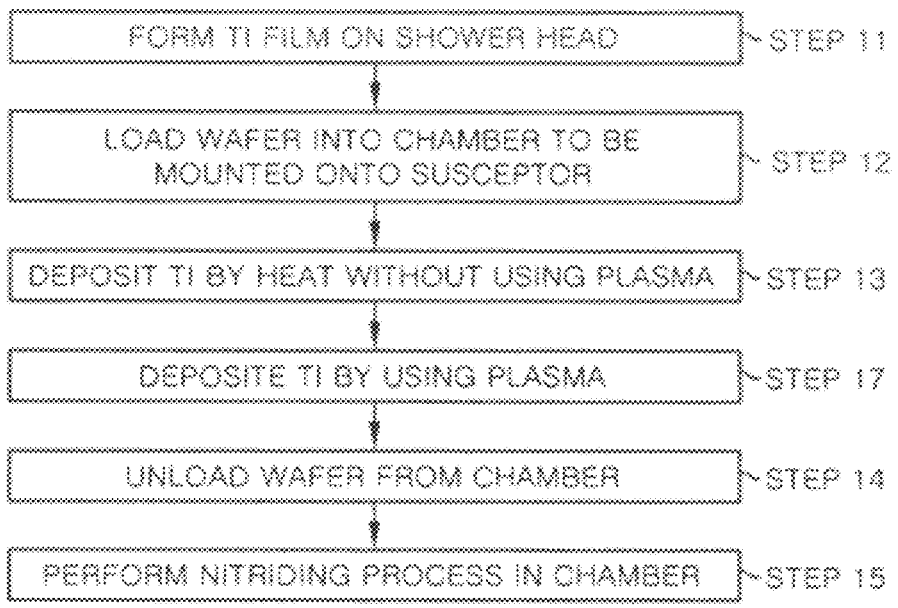
FIG. 16 is a flowchart for explaining the Ti film forming method that is executed in the film forming apparatus shown in FIG. 11 in accordance with the detailed embodiment of the present invention.

For that reason, as shown in a flowchart of FIG. 16, Ti is formed on the sidewall of the wafer W to have such a thickness that the electric connection to the bottom portion of the contact hole can be obtained in step 13 and, then, Ti can be deposited by using the plasma generated in the chamber 21 by supplying a high frequency power from the high frequency power source 54 to the shower head 30 (step 17). Accordingly, it is possible to shorten the film forming time by accelerating the film forming reaction. At this time, it is preferable to set the magnitude of the high frequency power in the range from 100 to 1500 W.

Figure 17:
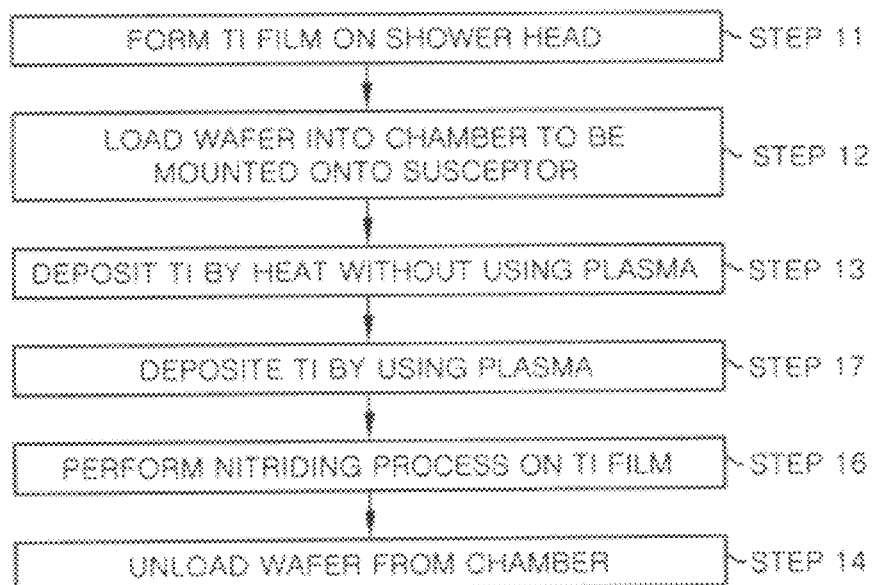
FIG. 17 is a flowchart for explaining the Ti film forming method that is executed in the film forming apparatus shown in FIG. 11 in accordance with the detailed embodiment of the present invention.

Further, as shown in a flowchart of FIG. 17, the nitriding process of step 16 may be carried out after step 17.

Figure 18:
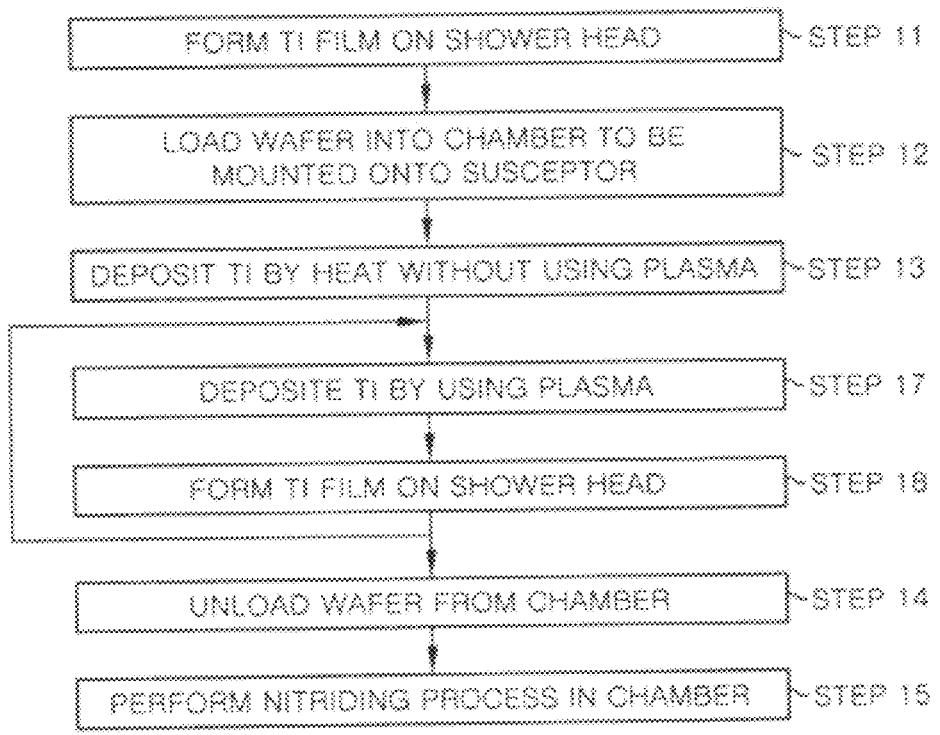
FIG. 18 is a flowchart for explaining the Ti film forming method that is executed in the film forming apparatus shown in FIG. 11 in accordance with the detailed embodiment of the present invention.

Alternatively, as shown in a flowchart of FIG. 18, after Ti is formed by using the plasma in step 17, Ti may be formed by using heat without using the plasma under the same conditions as those in step 13 (step 18). This is made possible because Ti can be deposited without using the plasma since a Ti film is formed on the surface of the shower head 30 when Ti is formed by using the plasma as in step 17. Steps 17 and 18 may be repeatedly performed many times.

Figure 19:
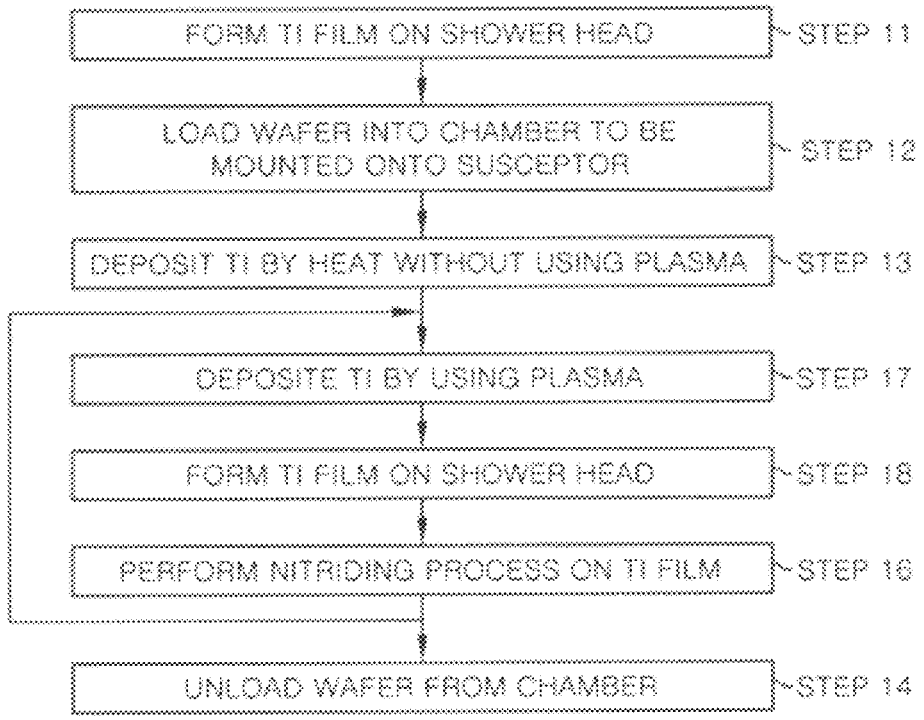
FIG. 19 is a flowchart for explaining the Ti film forming method that is executed in the film forming apparatus shown in FIG. 11 in accordance with the detailed embodiment of the present invention.
Figure 20:
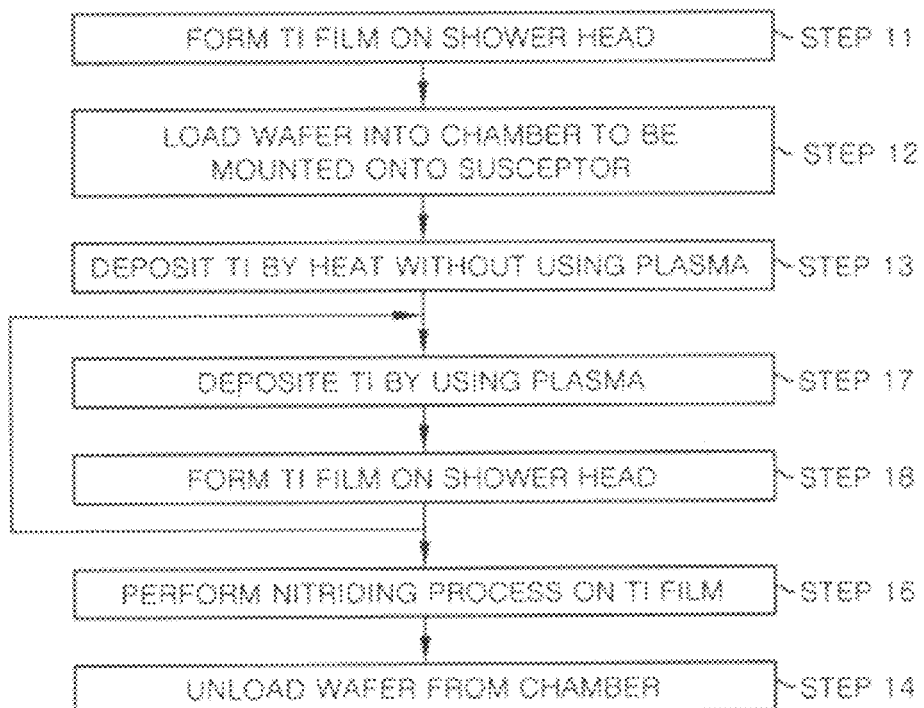
FIG. 20 is a flowchart for explaining the Ti film forming method that is executed in the film forming apparatus shown in FIG. 11 in accordance with the detailed embodiment of the present invention.

Flowcharts of FIGS. 19 and 20 show examples in which the nitriding process is carried out on the Ti film in step 16 after step 18 of FIG. 18. As shown in FIG. 19, steps 16, and 18 may be repeatedly carried out a predetermined number of times. Alternatively, in FIG. 20, steps 17 and 18 may be repeatedly carried out a predetermined number of times. Of course, such repetitions may not be performed.

Figure 21A:
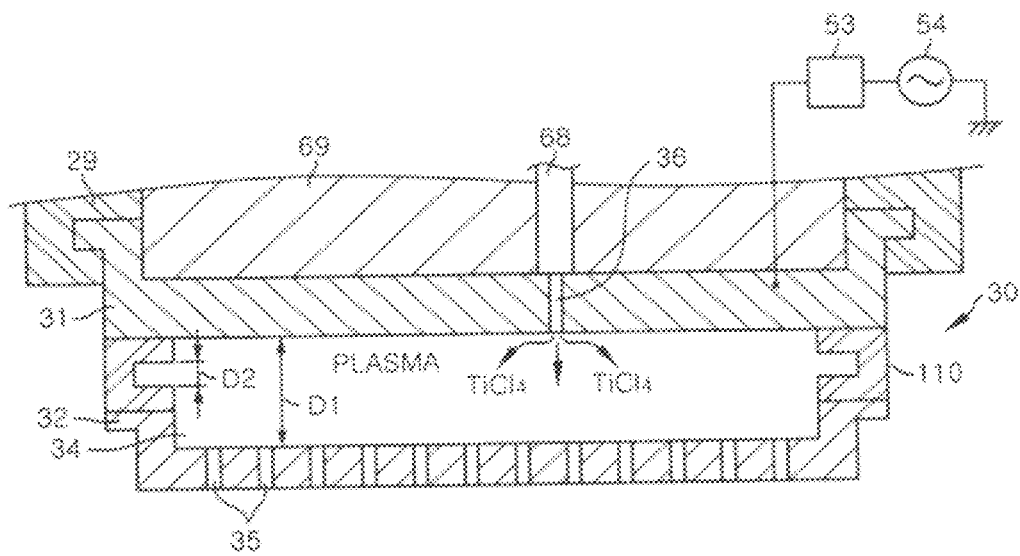
FIG. 21A is a cross sectional view showing a method for forming a Ti film on an inner surface of a shower head by using a different plasma generating unit.

In step 11, the Ti film is formed on the outer surface of the shower head 30. In this case, it is disadvantageous in that the Ti film is also formed on the susceptor 22 since the plasma is generated in the chamber 21 by generating a high frequency electric field between the shower head 30 and the electrode 28 of the susceptor 22. In order to avoid this, it is preferable to arrange an insulation member 110 between the base member 31 and the shower plate 32 and generate a plasma in the gas diffusion space 34 by a high frequency electric field generated between the base member 31 and the shower plate 32 by supplying a high frequency power from the high frequency power source 54 to the base member 31 as shown in FIG. 21A for example.

Figure 21B:
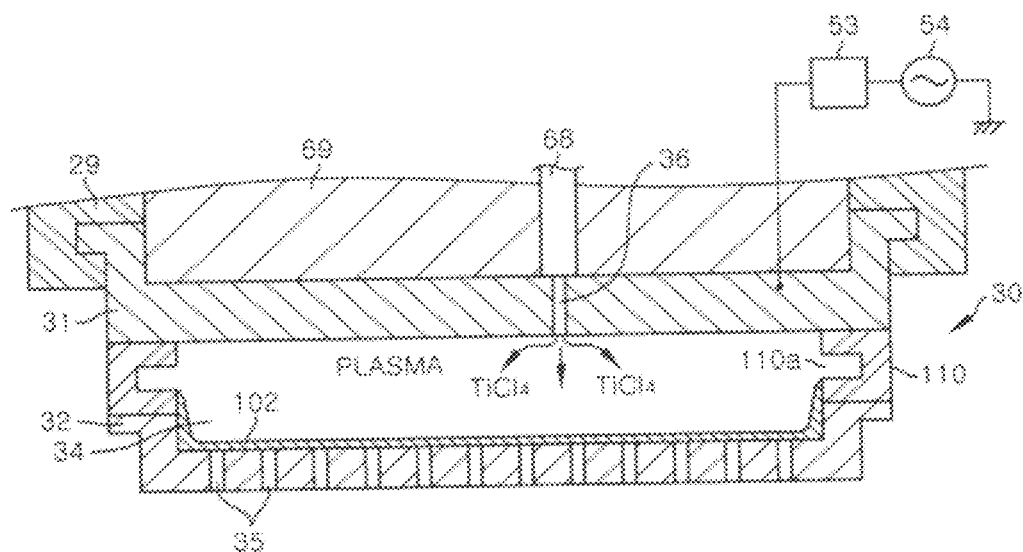
FIG. 21B is a cross sectional view showing a method for forming a Ti film on the inner surface of the shower head by using another different plasma generating unit.

Accordingly, as shown in FIG. 21B, it is possible to form a Ti film 102 on the inner surface of the shower head 30 without forming the Ti film 102 on the susceptor 202. As such, the Ti film 102 formed on the inner surface of the shower head 30 is provided in a supply path of TiCl$_4$ gas and, thus, the TiCl$_4$ gas reacts with the Ti film 102 by being brought into contact therewith, whereby the Ti precursor gas is produced. As a result, it is possible to form the Ti film on the surface of the wafer W without using the plasma.

Figure 22:
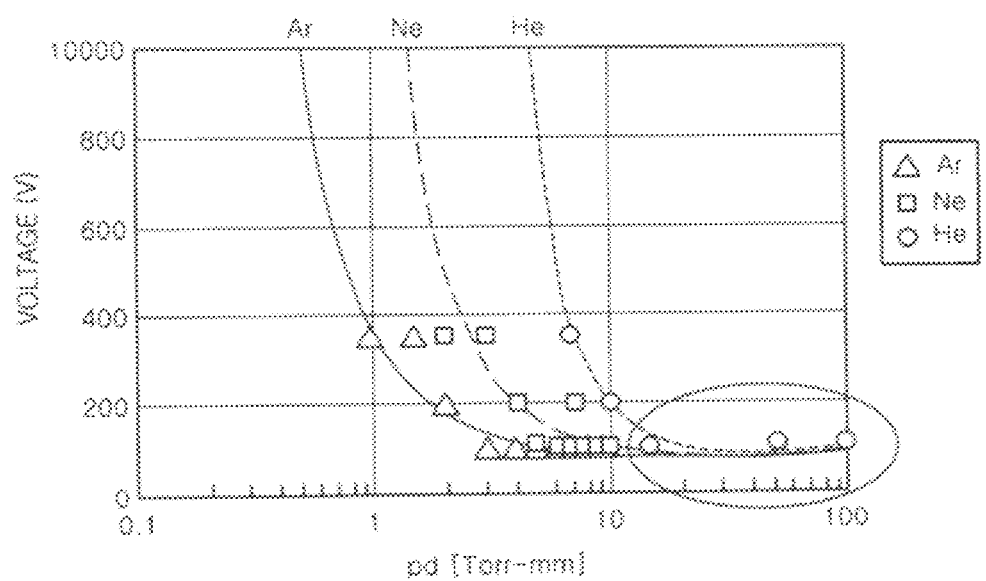
FIG. 22 shows Paschen's law.

In this case, a discharge is required to be generated between the base member 31 and the shower plate 32 in order to generate a plasma in the gas diffusion space 34 of the shower head 30. From the Paschen's law, it is seen that the voltage V for generating a discharge between parallel electrodes is obtained by using a function (V=f(pd)) of the multiplication of a gas pressure "p(Torr)" and an electrode distance "d(m)," the relationship of which is shown in FIG. 22. For example, when the gas pressure is set as 5 Torr, the discharge is generated in the case of the distance of 2 mm or more. In view of the real process pressure, it is preferable to set a distance D1 between the base member 31 and the shower plate 32 in the range from 10 to 30 mm.

In the meantime, if the base member 31 and the shower plate 32 are electrically connected to each other due to the Ti film formed on the insulation member 110, no discharge is generated in the gas diffusion space 34. Accordingly, it is preferable to form a recessed portion 110a on a surface of the insulation member 110 which faces the gas diffusion space 34, thereby preventing the electric connection between the base member 31 and the shower plate 32. At this time, it is seen from the Paschen's law that a distance D2 of the recessed portion 110a is preferably set in such a range, e.g., from 1 to 3 mm, that no discharge can go back to the recessed portion 110a.

Figure 23:
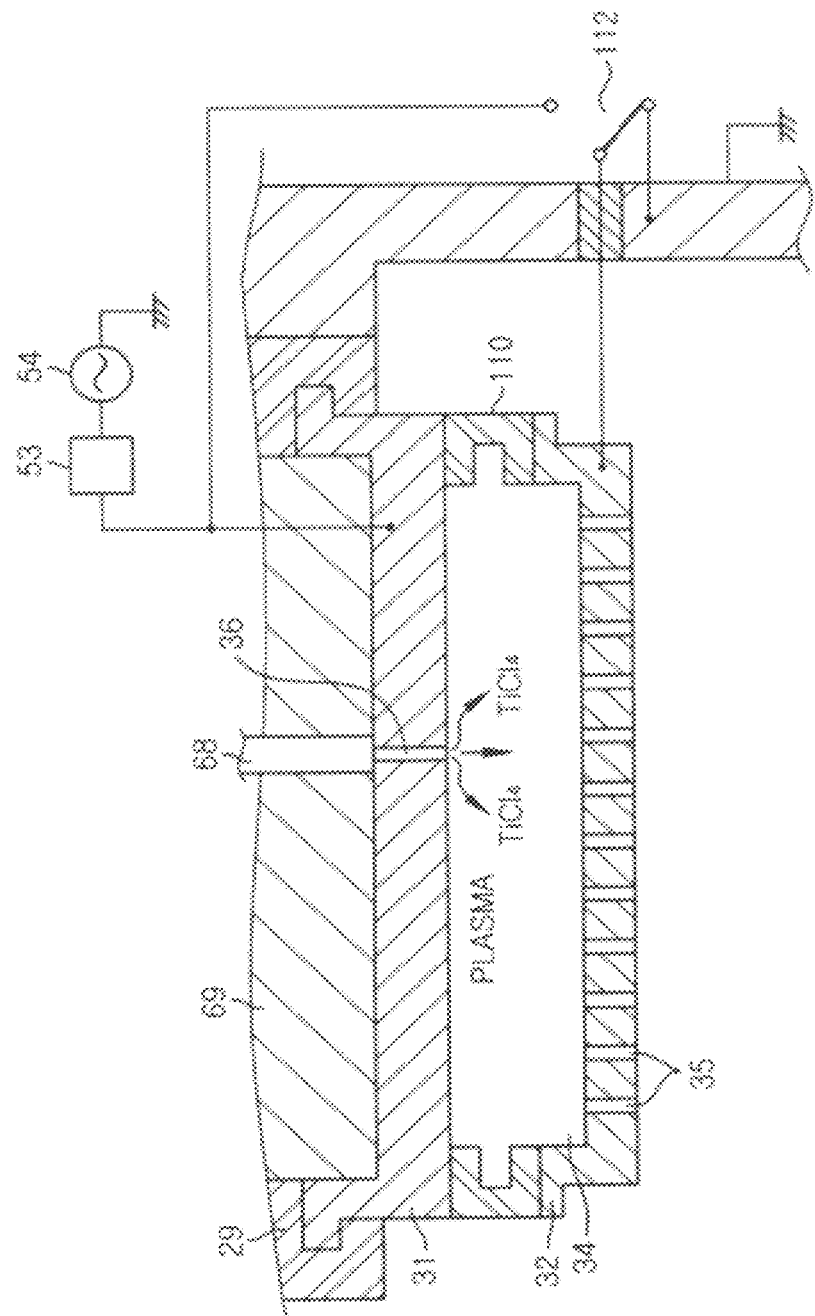
FIG. 23 is a cross sectional view showing main parts of a film forming apparatus in which a plasma can be selectively generated in a gas diffusion space or a chamber by using a high frequency power.

Further, in addition to forming the Ti film 102 on the inner surface of the shower head 30 by generating the plasma in the gas diffusion space 34, it is preferable to use a film forming apparatus having the configuration as shown in FIG. 23 in order to generate a plasma in the chamber 21 when Ti is deposited on the wafer W, as shown in the flowcharts of FIGS. 16 to 20.

In the film forming apparatus shown in FIG. 23, the insulation member 110 is arranged between the base member 31 and the shower plate 32 to selectively generate a plasma in the gas diffusion space 34 or in the chamber 21, and the high frequency power source 54 is configured to be connected to both the base member 31 and the shower plate 32. Further, a connection switch 112 is provided to control the connection and the disconnection between the high frequency power source 54 and the shower plate 32. Specifically, in the case of generating a plasma in the gas diffusion space 34 only, the connection switch 112 is controlled to cut off the connection between the high frequency power source 54 and the base member 31. In the case of generating a plasma in the chamber 21 as well as the gas diffusion space 34, the connection switch 112 is controlled to make the connection between the high frequency power source 54 and the base member 31.

Figure 24:
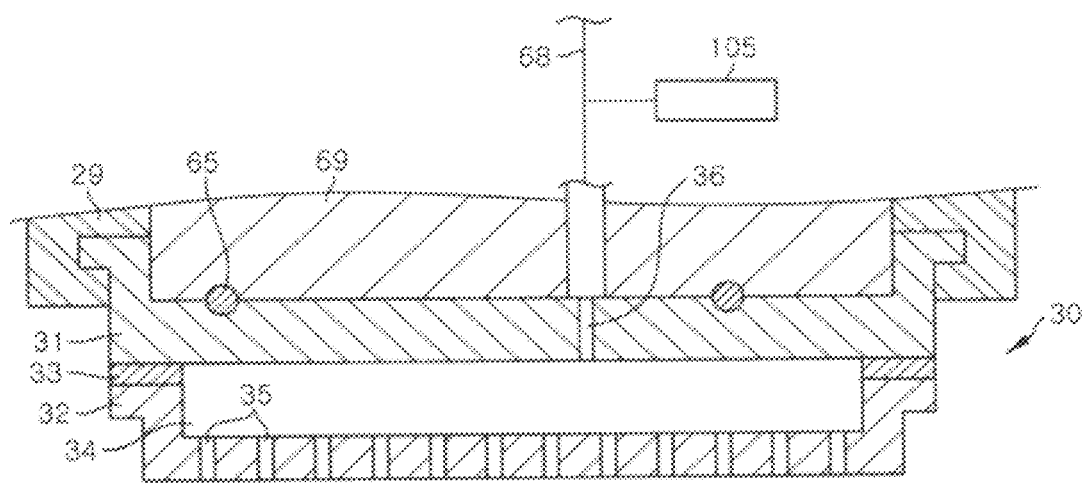
FIG. 24 is a cross sectional view showing a method for forming a Ti film on the inner surface of the shower head by using still another different plasma generating unit.

Instead of generating a plasma by generating a high frequency electric field between the base member 31 and the shower plate 32, a Ti film may be formed by connecting the gas line 68 to a remote plasma source 105 and using a plasma transferred from the remote plasmas source 105 as shown in FIG. 24. In this case, the Ti film is also formed in the gas line 68 at a supply side with regard to the shower head 30, in addition to the inner surface of the shower head 30.

As in the above embodiment, the Ti containing member may be arranged in advance in the supply path of TiCl$_4$ gas, e.g., the shower head 30 or the gas line instead of forming the Ti film on the shower head 30 by performing step 11.

Figure 25:
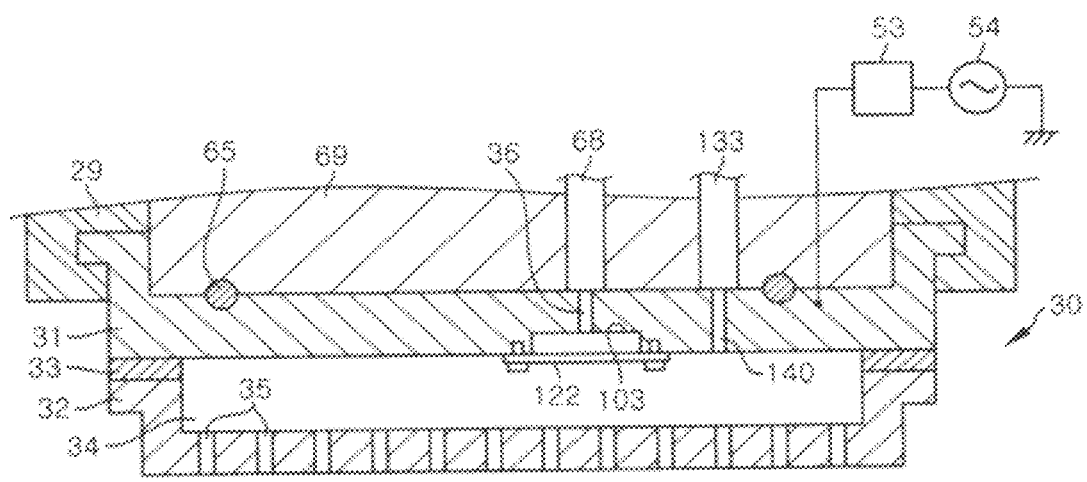
FIG. 25 is a cross sectional view showing an example in which a Ti containing member is arranged at a gas inlet of the gas diffusion space of the shower head instead of forming the Ti film in the shower head.

For example, as shown in FIG. 25, a Ti containing member 103 may be provided at a $TiCl_4$ gas introducing portion to the gas diffusion space 34 of the base member 31 of the shower head 30 such that the Ti containing member 103 communicates with the gas inlet hole 36. In the example, $TiCl_4$ gas is introduced into the gas diffusion space 34 of the shower head 30 through the gas line 68, the gas inlet hole 36 and the Ti containing member 103. In the meantime, $NH_3$ gas, $H_2$ gas and the like are introduced into the gas diffusion space 34 through an additional line 133 and an additional gas inlet hole 140.

Figure 26:
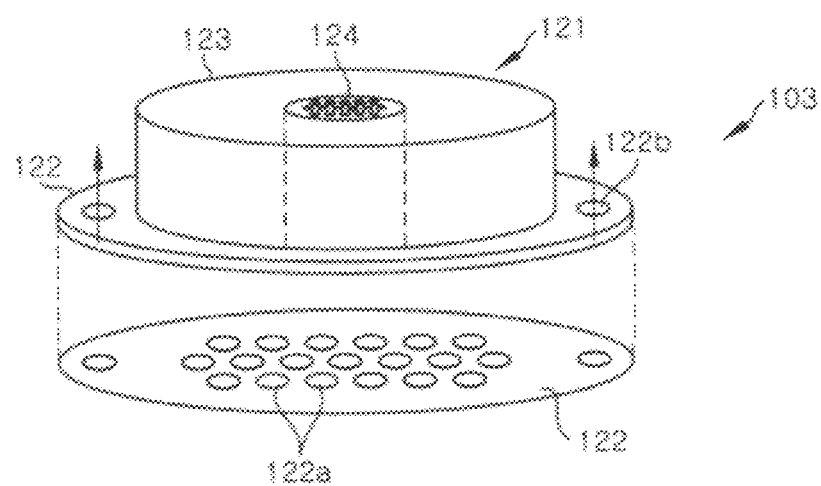
FIG. 26 is a perspective view showing the Ti containing member shown in FIG. 25.

The Ti containing member 103, as shown in a perspective view of FIG. 26, includes a disc shaped unit 121; and a flange portion 122 having a plurality of gas holes 122a, the flange portion 122 being provided at a lower portion of the disc shaped portion 121. The Ti containing member 103 is screw-fixed on a lower surface of the base member 31 by inserting screws into the screw holes 122b. The disc shaped unit 121 includes a cylindrical base 123 formed of a metal, such as Ni, having a high heat resistance and a high corrosion resistance; and a Ti portion 124 arranged in an inner space of the base 123.

A Ti member is arranged in the Ti portion 124 so that $TiCl_4$ gas can flow through the Ti member. Specifically, in the Ti portion 124, a grained Ti member is filled, or a mesh Ti member is arranged or a ventilated Ti member such as a honeycomb Ti member or the like is arranged. For that reason, when $TiCl_4$ gas supplied to the Ti containing member 103 through the gas line 68 and the gas inlet hole 36 flows through the Ti portion 124 that has been heated to a predetermined temperature, the $TiCl_4$ gas reacts with Ti by making contact with the Ti member. A Ti precursor gas produced by such reaction reaches the gas diffusion space 34 through the gas holes 122a and introduced into the chamber 21 through the gas injection holes 35.

Figure 27:
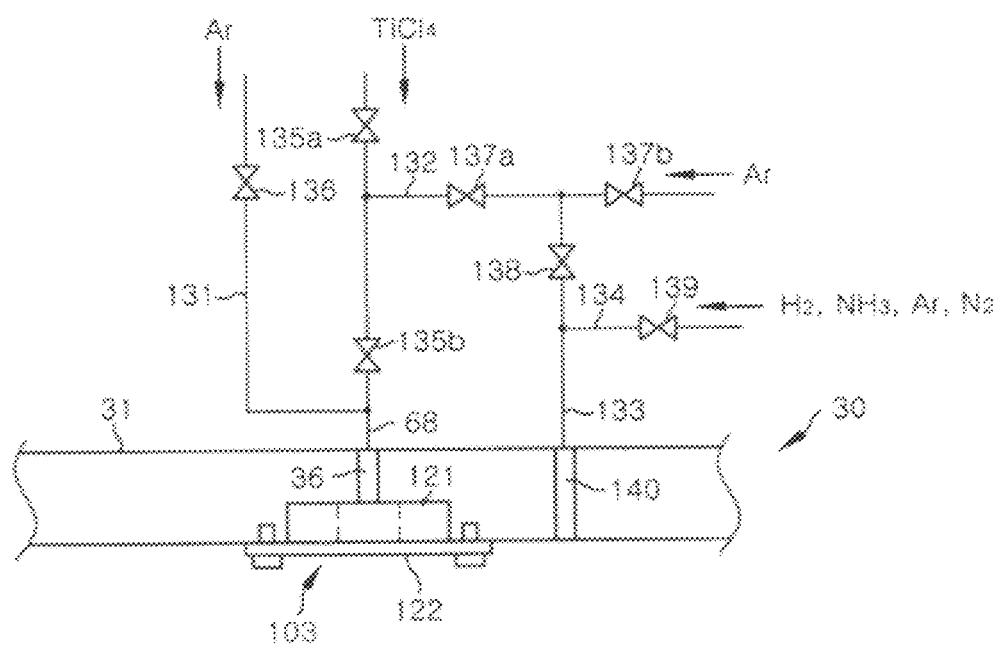
FIG. 27 shows a preferable example of a gas supply line in the case of providing the Ti containing member.

FIG. 27 shows a preferable example of a gas supply line in the case of providing the Ti containing member 103. A backflow prevention line 131 for preventing the backflow of $TiCl_4$ gas is connected to the gas line 68, through which $TiCl_4$ gas is supplied to the shower head 30, at a position close to the shower head 30. Further, a carrier gas line 132 is connected to the gas line 68 at an upstream side of a connection point between the gas line 68 and the backflow prevention line 131. In the gas line 68, on-off valves 135a and 135b are respectively provided at an upstream side of a connection point between the gas line 68 and the carrier gas line 132, and at a portion between the connection points of the gas line 68 with the backflow prevention line 131 and the carrier gas line 132. A backflow prevention gas, e.g., Ar gas, flows through the backflow prevention line 131. An on-off valve 136 is provided in the backflow prevention line 131.

A carrier gas, e.g., Ar gas, is supplied through the carrier gas line 132, and the carrier gas supplied through the carrier gas line 132 can be supplied through the gas line 68. In the carrier gas line 132, the gas line 133 is branched and extended to the base member 31 of the shower head 30. A gas inlet hole 140 is provided in a connection portion of the base member 31 with the gas line 133. In the carrier gas line 132, on-off valves 137a and 137b are respectively provided at downstream and upstream sides of the connection point between the carrier gas line 132 and the gas line 133.

A gas line 134 is connected to the gas line 133, and $NH_3$ gas, $H_2$ gas, Ar gas and/or $N_2$ gas are supplied to the gas line 134. These gases reach the gas line 133 through the gas line 134 and then introduced into the gas diffusion space 34 of the shower head 30 through the gas inlet hole 140. Further, an on-off valve 138 is provided in the gas line 133 at an upstream side of the connection point between the gas line 133 and the gas line 134, and on-off valve 139 is provided in the gas line 134. $TiCl_4$ gas supplied through the gas line 68 may bypass the Ti containing member 103 through the gas carrier lines 132, and the gas lines 133 and the gas inlet hole 140 to be introduced into the gas diffusion space 34 of the shower head 30.

In case that $TiCl_4$ gas is supplied to the Ti containing member 103 through the gas inlet hole 36, $TiCl_4$ gas is supplied to the gas line 68 while supplying a carrier gas by opening the on-off valves 135a, 135b, 136, 137a and 137b. At this time, at least one of $NH_3$ gas, $H_2$ gas, Ar gas and $N_2$ gas is introduced into the gas diffusion space 34 through the gas lines 134 and 133 and the gas inlet hole 140 under the state in which the on-off valve 138 is closed and the on-off valve 139 is opened. Further, in case that $TiCl_4$ gas is introduced into the gas diffusion space 34 together with the other gases through the gas line 133 and the gas inlet hole 140, the on-off valves 135b and 137b are closed and the on-off valves 135a, 136, 137a, 138 and 139 are opened.

Figure 28:
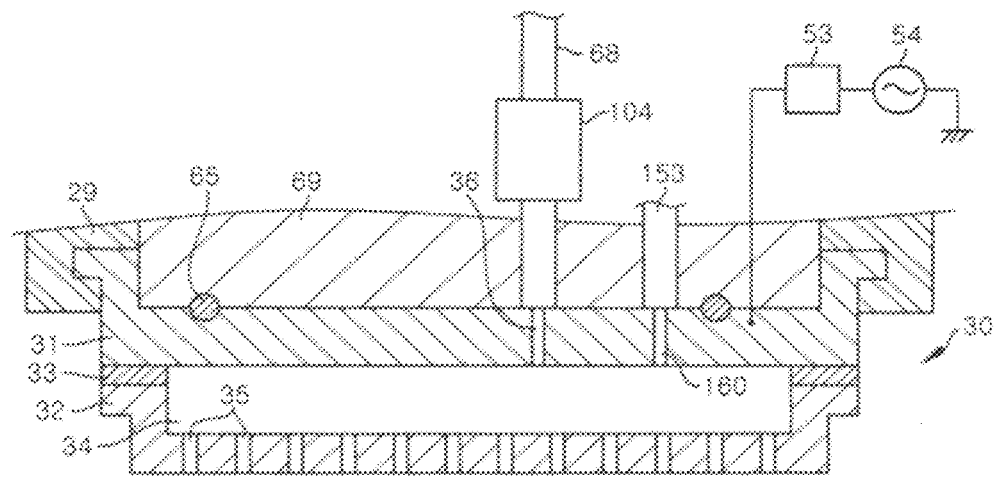
FIG. 28 is a cross sectional view showing an example in which a Ti containing member is arranged in a gas line instead of forming a Ti film in the shower head.

As an example in which the Ti containing member is arranged in the line as the supply path of $TiCl_4$ gas, the case of arranging a Ti containing member 104 in the gas line 68 may be taken as shown in FIG. 28. In the example, $TiCl_4$ gas flows through the Ti containing member 104 arranged in the gas line 68 to be introduced into the gas diffusion space 34 of the shower head 30 through the gas line 68 and the gas inlet hole 36, while $NH_3$ gas, $H_2$ gas and the like are introduced into the gas diffusion space 34 through an additional line 153 and an additional gas inlet hole 160.

Figure 29:
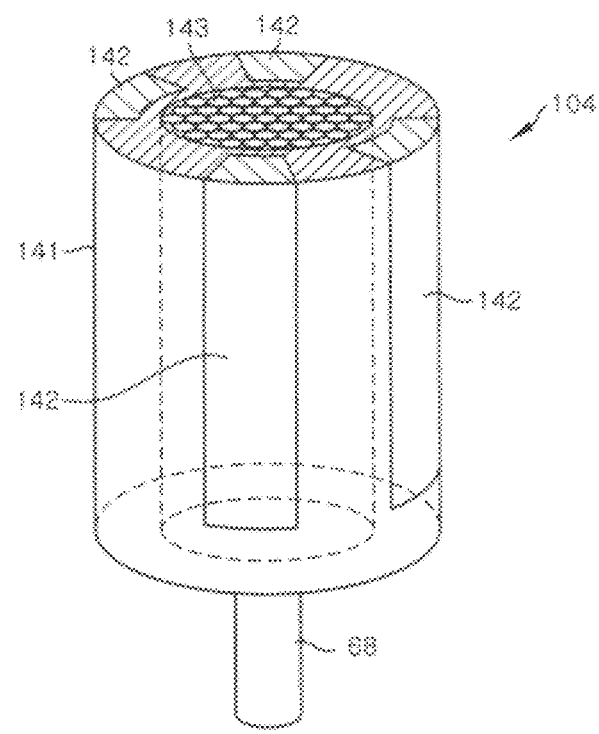
FIG. 29 is a perspective view showing a partial cross section of the Ti containing member.

As shown in a perspective view of FIG. 29, the Ti containing member 104 includes a substantially cylindrical base 141 formed of a metal, such as Ni, having a high heat resistance and a high corrosion resistance; a cartridge heater 142 buried at an outer periphery of the base member 141; and a Ti portion 143 arranged in an inner space of the base member 141.

A Ti member is arranged in the Ti portion 143 so that $TiCl_4$ gas can flow through the Ti member. Specifically, in the Ti portion 143, a grained Ti member is filled, or a mesh Ti member or a ventilated member such as a honeycomb Ti member or the like is arranged. For that reason, when $TiCl_4$ gas supplied to the Ti containing member 104 through the gas line 68 flows through the Ti portion 143 that has been heated to a predetermined temperature by the cartridge heater 142, the $TiCl_4$ gas reacts with Ti by making contact with the Ti member. A Ti precursor gas produced by such reaction reaches the gas diffusion space 34 through the gas line 68 and the gas inlet hole 36 and introduced into the chamber 21 through the gas injection holes 35.

Figure 30:
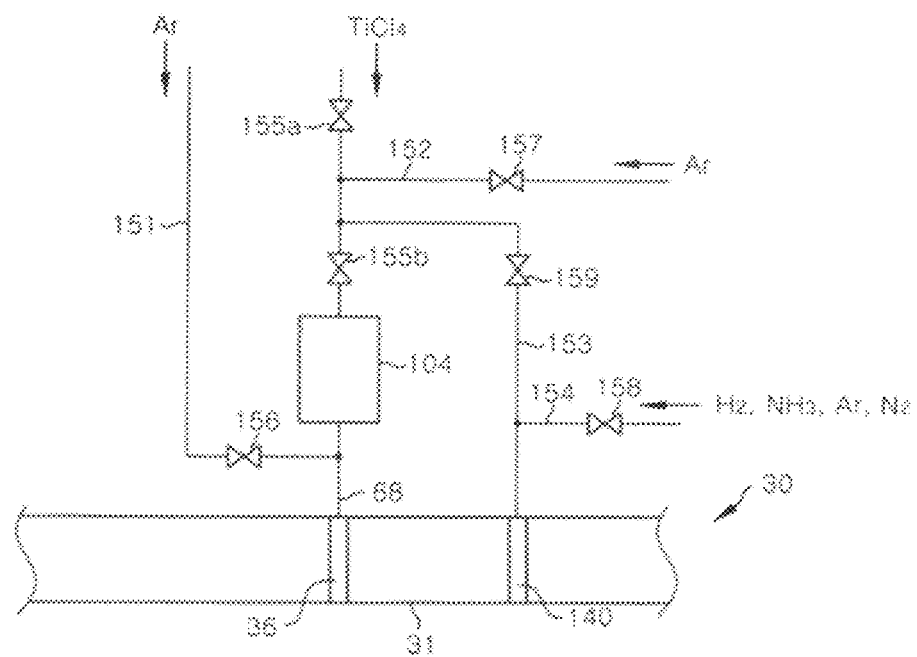
FIG. 30 shows a preferable example of the gas supply line in the case of providing the Ti containing member shown in FIG. 28.

FIG. 30 shows a preferable example of the gas supply line in the case of providing the Ti containing member 104. A backflow prevention line 151 for preventing the backflow of $TiCl_4$ gas is connected to the gas line 68, through which $TiCl_4$ gas is supplied to the shower head 30, at a downstream side of the Ti containing member. Further, a carrier gas line 152 is connected to the gas line 68 at an upstream side of the Ti containing member 104, and the gas line 153 is connected to the gas line 68 at a downstream side of the connection point between the gas line 68 and the carrier gas line 152.

In the gas line 68, on-off valves 155a and 155b are respectively provided at an upstream side of the connection point between the gas line 68 and the carrier gas line 152, and at a portion between the Ti containing member 104 and the connection point of the gas line 68 with the gas line 153. A backflow prevention gas, e.g., Ar gas, flows through the backflow prevention line 151. An on-off valve 156 is provided in the backflow prevention line 151. A carrier gas, e.g., Ar gas, is supplied through the carrier gas line 152, and the carrier gas supplied through the carrier gas line 152 can be supplied through the gas line 68. An on-off valve 157 is provided in the carrier gas line 152.

The gas line 153 is extended to the base member 31, and the gas inlet hole 160 is formed at a connection portion of the base member 31 with the gas line 153. A gas line 154 is connected to the gas line 153, and $NH_3$ gas, $H_2$ gas, Ar gas and/or $N_2$ gas are supplied to the gas line 154. These gases reach the gas line 153 through the gas line 154 to be introduced into the gas diffusion space 34 of the shower head 30 through the gas inlet hole 160. Further, an on-off valve 159 is provided in the gas line 153 at an upstream side of the connection point between the gas lines 153 and the gas line 154, and on-off valve 158 is provided in the gas line 154. $TiCl_4$ gas supplied through the gas line 68 may bypass the Ti containing member 104 through the gas line 153 and the gas inlet hole 160 to be introduced into the gas diffusion space 34 of the shower head 30.

In case that $TiCl_4$ gas is introduced into the gas diffusion space 34 of the shower head 30 via the Ti containing member 104, $TiCl_4$ gas is supplied to the gas line while supplying a carrier gas by opening the on-off valves 155a, 155b, 156 and 157. At this time, at least one of $NH_3$ gas, $H_2$ gas, Ar gas and $N_2$ gas is introduced into the gas diffusion space 134 through the gas lines 154 and 153 and the gas inlet hole 160 under the state in which the on-off valve 158 is opened and the on-off valve 159 is closed. Further, in case that $TiCl_4$ gas is introduced into the gas diffusion space 34 together with the other gases through the gas line 153 and the gas inlet hole 160, the on-off valve 155b is closed and the on-off valves 156, 158 and 159 are opened.

In the examples shown in FIGS. 25 and 28, since $NH_3$ gas is not supplied to the Ti containing member 103 and 104, there is no fear in that it becomes difficult to make the generation reaction of $TiCl_3$ gas or $TiCl_2$ gas by nitriding the surfaces of the Ti containing member 103 and 104. Even when a post-mix shower head is employed, it is possible to prevent such fear.

Next, results of tests executed to verify the present invention will be described.

In the tests, the apparatus shown in FIG. 11 was used and the surface temperature of the shower head 30 was set to be 480° C. by respectively setting the temperatures of the susceptor 22 and the heater 65 to be 640° C. and 370° C. First, a Ti film of about 25 nm was formed on the surface (outer surface) of the shower head 30 in 90 seconds by applying a high frequency power of 800 W from the high frequency power source to the shower head while supplying $TiCl_4$ gas, $H_2$ gas and Ar gas at the respective flow rates of 12, 4000 and 1600 mL/min (sccm) without loading a wafer into the chamber.

Thereafter, a silicon wafer was loaded into the chamber while identically maintaining the susceptor temperature and the shower head temperature. Then, a Ti film was formed on a surface of the silicon wafer by supplying $TiCl_4$ gas, $H_2$ gas and Ar gas at the same flow rates as those in the case of forming the Ti film on the shower head. The thickness of the thus-formed Ti film was 10 nm by measuring it using X-ray fluorescence (XRF).

Figure 31:
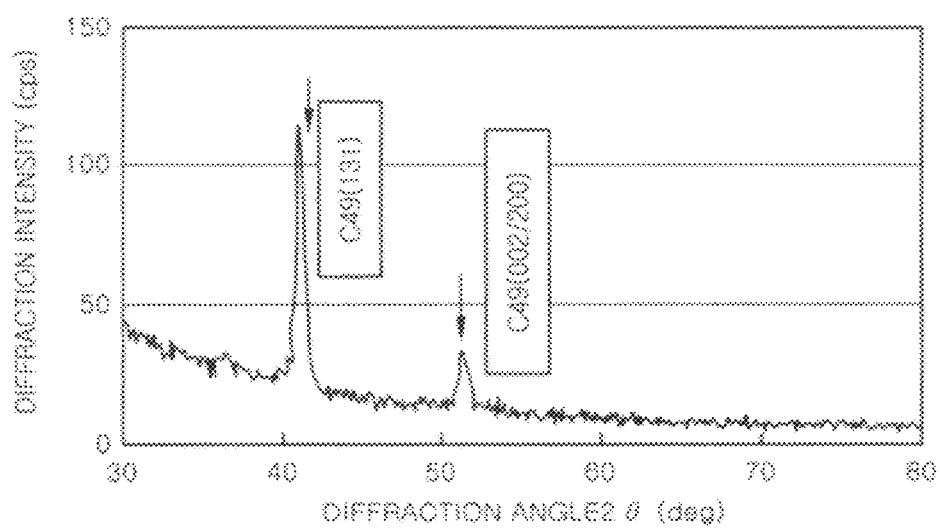
FIG. 31 shows an X-ray diffraction profile of a formed film in a test for verifying the present invention.

Next, the X-ray diffraction was used to characterize the crystalline phase of the formed film, and the result is shown in FIG. 31. As a result, it was seen that C49 phase of $TiSi_2$ was formed as in the conventional method using a plasma. Further, it was seen that the resistance Rs of the film was 51 Ω/sq with the variation of 8% at 1 σ, and the resistivity was 102 Ω·cm.

Figure 32:
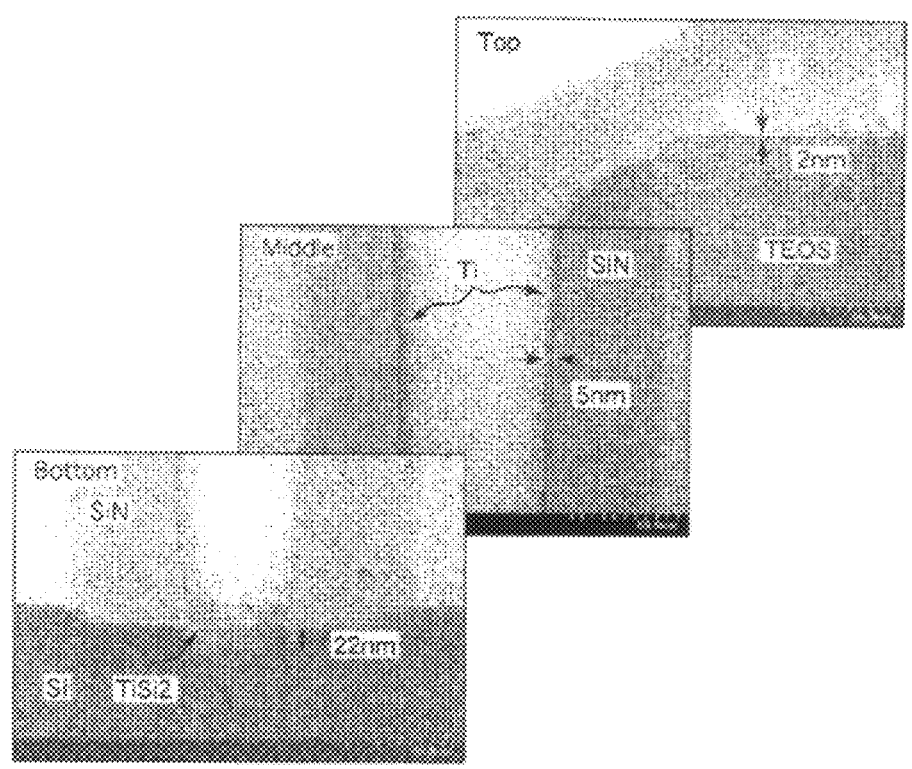
FIG. 32 is transmission electron microscope (TEM) pictures showing a cross section of a film formed on a contact hole in a test for verifying the present invention.

Next, a Ti film was formed by using a wafer having the same structure as shown in FIG. 6 under the same conditions. As for the shape of the contact hole, the hole diameter and the hole depth were 60 nm and 550 nm, respectively. FIG. 32 is transmission electron microscope (TEM) pictures showing a cross section of a film formation state of the contact hole. As shown therein, the film thickness of a top layer of the interlayer dielectric film was 2 nm, while the film thickness of a middle layer and a bottom layer of the contact hole were 5 nm (step coverage: 250%) and 22 nm (step coverage: 1100%), respectively, which were satisfactory results.

The present invention is not limited to the above embodiment, and various modifications are possible. For example, although a Ti film is formed on a silicon wafer (silicon substrate) in the above embodiment, a Ti film may be formed on, e.g., a ploy silicon film formed on the wafer without being limited thereto. Further, the present invention is not limited to a semiconductor wafer as a target substrate to be processed. For example, a substrate for a liquid crystal display (LCD), a glass substrate, a ceramic substrate or the like may be used.

What is claimed is:

1. A film forming method comprising:
arranging a target substrate to be processed in a chamber;
supplying a processing gas including a chlorine containing gas through a supply path to the chamber in which the target substrate is arranged;
arranging a Ti containing unit in the supply path of the processing gas and making a reaction between the chlorine containing gas of the processing gas and Ti of the Ti containing unit by bringing the chlorine containing gas into contact with the Ti containing unit, when the processing gas is supplied to the chamber; and
depositing Ti on a surface of the target substrate by a thermal reaction by supplying to the target substrate a Ti precursor gas produced by the reaction between the chlorine containing gas and Ti of the Ti containing unit while heating the target substrate provided in the chamber,
wherein the supply path includes a gas line through which the processing gas is supplied from a gas supply source and a gas introduction mechanism for introducing the processing gas supplied through the gas line into the chamber, and the Ti containing unit is arranged in the gas line or the gas introduction mechanism, and
wherein, after the depositing of Ti on the surface of the target substrate by the thermal reaction, Ti is further deposited while generating a plasma of the processing gas in the chamber.

2. The method of claim 1, wherein the Ti containing unit includes a Ti film formed on an outer or inner surface of the gas introduction mechanism.

3. The method of claim 1, wherein the Ti containing unit includes a Ti containing member provided in the gas introduction mechanism or the gas supply line.

4. The method of claim 3, wherein the Ti containing member includes a Ti member arrangement portion in which a grained Ti member is filled, or a mesh Ti member or a ventilated Ti member is arranged.

5. The method of claim 1, wherein the making of the reaction between the chlorine containing gas and Ti of the Ti containing unit is carried out in a temperature range from 200 to 800° C.

6. The method of claim 1, wherein the depositing of Ti on the surface of the target substrate by the thermal reaction is carried out while heating the target substrate in a temperature range from 200 to 800° C.

7. The method of claim 1, wherein the chlorine containing gas is $TiCl_4$ gas, and the Ti precursor gas is $TiCl_3$ gas or $TiCl_2$ gas.

8. The method of claim 7, wherein $TiCl_3$ gas is produced as the Ti precursor gas by making the reaction between the chlorine containing gas and Ti of the Ti containing unit in a temperature range from 425 to 500° C.

9. The method of claim 7, wherein $TiCl_2$ gas is produced as the Ti precursor gas by making the reaction between the chlorine containing gas and Ti of the Ti containing unit at a temperature higher than 500° C.

10. The method of claim 7, wherein the depositing of Ti on the surface of the target substrate by the thermal reaction is carried out by setting a temperature of the target substrate to be higher than 500° C., adsorbing $TiCl_2$ onto the surface of the target substrate and separating Cl from $TiCl_2$.

11. The method of claim 1, wherein the depositing of Ti by the thermal reaction and the depositing of Ti by the plasma are repeatedly carried out.

12. The method of claim 1, wherein the processing gas including the chlorine containing gas further includes $H_2$ gas.

13. The method of claim 1, wherein the processing gas including the chlorine containing gas further includes an inert gas.

14. The method of claim 1, wherein a Ti film is formed on the surface of the target substrate by the depositing of Ti.

15. The method of claim 1, wherein a Si containing portion is provided on the surface of the target substrate, and a $TiSi_x$ film is formed on the surface of the target wafer by the depositing of Ti.

16. A film forming method comprising:
    forming a Ti film in a gas introduction mechanism for introducing a processing gas to a chamber by supplying a gas including $TiCl_4$ gas to the gas introduction mechanism under a state in which a target substrate to be processed is not arranged in the chamber;
    loading the target substrate into the chamber;
    introducing a processing gas including a chlorine containing gas to the chamber through the gas introduction mechanism;
    making a reaction between the chlorine containing gas of the processing gas and Ti of the Ti film by bringing the chlorine containing gas into contact with the Ti film, when the processing gas is introduced to the chamber; and
    depositing Ti on a surface of the target substrate by a thermal reaction by supplying to the target substrate a Ti precursor gas produced by the reaction between the chlorine containing gas and Ti of the Ti film while heating the target substrate provided in the chamber.

17. The method of claim 16, wherein the forming of the Ti film in the gas introduction mechanism is carried out while generating a plasma.

18. The method of claim 17, wherein, in the forming of the Ti film in the gas introduction mechanism, the Ti film is formed on an outer surface of the gas introduction mechanism while a plasma is generated in the chamber.

19. The method of claim 17, wherein, in the forming of the Ti film in the gas introduction mechanism, the Ti film is formed on an inner surface of the gas introduction mechanism while a plasma is generated in the gas introduction mechanism.

20. The method of claim 16, wherein the making of the reaction between the chlorine containing gas and the Ti film is carried out in a temperature range from 200 to 800° C.

21. The method of claim 16, wherein the depositing of Ti on the surface of the target substrate by the thermal reaction is carried out while heating the target substrate in a temperature range from 200 to 800° C.

22. The method of claim 16, wherein the chlorine containing gas is $TiCl_4$ gas, and the Ti precursor gas is $TiCl_3$ gas or $TiCl_2$ gas.

23. The method of claim 22, wherein $TiCl_3$ gas is produced as the Ti precursor gas by making the reaction between the chlorine containing gas and Ti of the Ti containing unit in a temperature range from 425 to 500° C.

24. The method of claim 22, wherein $TiCl_2$ gas is produced as the Ti precursor gas by making the reaction between the chlorine containing gas and Ti of the Ti containing unit at a temperature higher than 500° C.

25. The method of claim 22, wherein the depositing of Ti on the surface of the target substrate by the thermal reaction is carried out by setting a temperature of the target substrate to be higher than 500° C., adsorbing $TiCl_2$ onto the surface of the target substrate and separating Cl from $TiCl_2$.

26. The method of claim 16, wherein, after the depositing of Ti on the surface of the target substrate by the thermal reaction, Ti is deposited while generating a plasma of the processing gas in the chamber.

27. The method of claim 26, wherein the depositing of Ti by the thermal reaction and the depositing of Ti by the plasma are repeatedly carried out.

28. The method of claim 16, wherein the processing gas including the chlorine containing gas further includes $H_2$ gas.

29. The method of claim 16, wherein the processing gas including the chlorine containing gas further includes an inert gas.

30. The method of claim 16, wherein a Ti film is formed on the surface of the target substrate by the depositing of Ti.

31. The method of claim 16, wherein a Si containing portion is provided on the surface of the target wafer, and a $TiSi_x$ film is formed on the surface of the target wafer by the depositing of Ti.

32. A film forming apparatus comprising:
    a chamber for accommodating therein a target substrate to be processed;
    a mounting table for mounting the target substrate thereon in the chamber;
    a first heater for heating the target substrate mounted on the mounting table;
    a gas introduction mechanism for introducing a processing gas from a gas supply source to the chamber through a gas line;
    a Ti containing unit provided in a supply path of the processing gas;
    a second heater for heating the Ti containing unit;
    a gas exhaust unit for exhausting the chamber; and
    a control unit for controlling a processing in the chamber, wherein, under the control of the control unit,
    the target substrate is loaded into the chamber to be mounted onto the mounting table;
    a processing gas including a chlorine containing gas is introduced into the chamber through the supply line and the gas introduction mechanism;
    the chlorine containing gas of the processing gas is made to react with Ti of the Ti containing unit by bringing the chlorine containing gas into contact with the Ti containing unit and heating it with the second heater;

Ti is deposited on a surface of the target substrate by a thermal reaction by supplying to the target substrate a Ti precursor gas produced by the reaction between the chlorine containing gas of the processing gas and Ti of the Ti containing unit while heating the target substrate mounted on the mounting table with the first heater; and Ti is further deposited while generating a plasma of the processing gas in the chamber after depositing Ti on the surface of the target substrate by the thermal reaction.

33. A film forming apparatus comprising:

a chamber for accommodating therein a target substrate to be processed;

a mounting table for mounting the target substrate thereon in the chamber;

a first heater for heating the target substrate mounted on the mounting table;

a gas introduction mechanism for introducing a processing gas from a gas supply source to the chamber through a gas line;

a second heater for heating the gas introduction mechanism;

a plasma generating unit for generating a plasma of the processing gas;

a gas exhaust unit for exhausting the chamber; and a control unit for controlling a processing in the chamber, wherein, under the control of the control unit, a Ti film is formed in the gas introduction mechanism by supplying $TiCl_4$ gas to the gas introduction mechanism under a state in which the target substrate is not arranged in the chamber;

the target substrate is loaded into the chamber to be mounted onto the mounting table;

a processing gas including a chlorine containing gas is introduced into the chamber through the supply line and gas introduction mechanism;

the chlorine containing gas of the processing gas is made to react with Ti of the Ti film by bringing the chlorine containing gas into contact with the Ti film and heating it with the second heater; and Ti is deposited on a surface of the target substrate by a thermal reaction by supplying to the target substrate a Ti precursor gas produced by the reaction between the chlorine containing gas of the processing gas and Ti of the Ti film while heating the target substrate mounted on the mounting table with the first heater.

* * * * *